United States Patent [19]
Kondo et al.

[11] Patent Number: 5,724,145
[45] Date of Patent: Mar. 3, 1998

[54] OPTICAL FILM THICKNESS MEASUREMENT METHOD, FILM FORMATION METHOD, AND SEMICONDUCTOR LASER FABRICATION METHOD

[75] Inventors: Takayuki Kondo; Katsumi Mori; Takeo Kaneko, all of Suwa, Japan

[73] Assignee: Seiko Epson Corporation, Tokyo, Japan

[21] Appl. No.: 679,714

[22] Filed: Jul. 12, 1996

[30] Foreign Application Priority Data

Jul. 17, 1995 [JP] Japan .................. 7-202872

[51] Int. Cl.⁶ .................................. G01B 11/06
[52] U.S. Cl. ..................... 356/382; 250/559.28
[58] Field of Search .................... 356/381, 382; 250/559.27, 559.28

[56] References Cited

U.S. PATENT DOCUMENTS 5,410,411  4/1995  Uchida et al. ................. 356/381

FOREIGN PATENT DOCUMENTS

A-1-320408  12/1989  Japan .
B2-7-22132   3/1995  Japan .

OTHER PUBLICATIONS

K. Bacher et al., "Molecular beam epitaxy growth of vertical cavity optical devices with in situ corrections," Jul. 21, 1992, pp. 1387-1389.

Primary Examiner—F. L. Evans
Attorney, Agent, or Firm—Oliff & Berridge, P.L.C.

[57] ABSTRACT

An optical film thickness measurement method and film formation method uses a method of measuring the optical thickness of films by radiating a monitor light beam towards a substrate during the formation of a stack of films on the substrate and measuring the optical film thickness from extreme values in the resultant reflection intensity. This stack of films comprises a first film having a reflectance of at least 98% within a predetermined wavelength range and a second film formed on the first film and having an absorption coefficient of 1000 $cm^{-1}$ or less within that predetermined wavelength range. The first film is measured by a first monitor light beam having a predetermined wavelength and the second film is measured by a second monitor light beam having a wavelength that differs from the predetermined wavelength range.

16 Claims, 16 Drawing Sheets

OPTICAL FILM THICKNESS MEASUREMENT METHOD, FILM FORMATION METHOD, AND SEMICONDUCTOR LASER FABRICATION METHOD

TECHNICAL FIELD OF THE INVENTION

This invention relates to a method of measuring optical film thickness used during the formation of a stack of a plurality of layers on a substrate, and a film formation method and a method of fabricating a semiconductor laser to which this optical film thickness measurement method is applied.

BACKGROUND ART

A semiconductor laser is fabricated by forming a stack of a plurality of semiconductor layers by epitaxial crystal growth on a substrate.

In the prior art, the crystal growth speed of this type of crystal growth method is determined beforehand from the film thickness of the semiconductor layer which is obtained by thickness measurement of a cross-section or the reflection spectrum of a sample substrate after a predetermined semiconductor layer is formed thereon in the reaction tube then taken out thereof. The film thickness of each layer in practice is controlled by this crystal growth speed and the film formation time. However, this method has some problems.

The first problem with this method relates to the way in which the crystal growth speed must be kept constant at all times, but actually it is not between lots and such variations in the growth speed make it impossible to control the film thickness accurately. An essential characteristic of a distributed-Bragg reflection type of multilayer film mirror (DBR mirror), for example, is a high level of reflectance obtained by accurately controlling the optical film thicknesses of the semiconductor layers thereof. However, variations in growth speed with the prior-art method for control that relies on crystal growth speed and growth time make it difficult to control the optical film thickness accurately, and thus it is difficult to create a product that conforms to the reflectance wavelength range for light as it is designed.

A second problem concerns the way in which the value of the refractive index n is used as a factor in determining the optical film thickness, but the refractive index of a semiconductor layer also varies with the wavelength of the incident light. It is therefore necessary to measure the refractive index of each layer strictly with light of a predetermined wavelength, but making this measurement extremely difficult to perform.

SUMMARY OF THE INVENTION

An objective of this invention is therefore to provide an optical film thickness measurement method and film formation method which make it possible to form a film while simultaneously measuring the optical film thickness accurately, and which are particularly suitable for the formation of a stack of semiconductor layers comprising a layer having a high reflectance such as a semiconductor laser having a reflective mirror.

Another objective of this invention is to provide a method of fabricating a semiconductor laser to which the above optical film thickness measurement method and film formation method are applied.

The optical film thickness measurement method of this invention relates to a method in which a monitor light beam is radiated towards a substrate during the formation of a stack of films on the substrate, and optical film thickness is obtained from extreme value of the reflection intensity of light reflected therefrom, wherein the stack of films comprises a first film having a reflectance of at least 98% within a predetermined wavelength range and a second film formed on the first film and having an absorption coefficient of 1000 cm$^{-1}$ or less within the predetermined wavelength range;

the optical film thickness measurement method comprises the steps of:

measuring the first film by a first monitor light beam of a predetermined wavelength; and measuring the second film by a second monitor light beam of a wavelength that differs from the predetermined wavelength range.

This invention also relates to a film formation method to which this optical film thickness measurement method is applied, such that this film formation method is used for forming a stack of a plurality of films on a substrate;

wherein the stack of a films comprises a first film having a reflectance of at least 98% within a predetermined wavelength range and a second film formed on the first film and having an absorption coefficient of 1000 cm$^{-1}$ or less within the predetermined wavelength range;

the first film is formed while a first monitor light beam having a predetermined wavelength is radiated towards the substrate and the optical film thickness thereof is monitored from extreme value of the reflection intensity of light reflected therefrom; and the second film is formed while a second monitor light beam of a wavelength different from those in the predetermined wavelength range is radiated towards the substrate and the optical film thickness thereof is monitored from extreme value of the reflection intensity of light reflected therefrom.

In these optical film thickness measurement and film formation methods, during the formation of a second film having an absorption coefficient of 1000 cm$^{-1}$ or less, preferably 100 cm$^{-1}$ or less, on a first film having a predetermined wavelength range (hereinafter called a "higher reflectance range") of a high level of reflectance that is at least 98%, preferably at least 99%, and more preferably at least 99.5%, the wavelength of a monitor light beam for the second film is selected from wavelengths that are different from those of the higher reflectance range.

Setting the wavelength of the second monitor light beam to be different from the wavelengths of the higher reflectance range of the first film in this way makes it possible to accurately measure the optical film thickness of a second film that has a small absorption coefficient (that is, an absorption coefficient within the above numeric region) and is transparent or close to transparent, irrespective of the effects of reflection from the first film, and thus the optical film thickness can be accurately controlled.

This second monitor light beam preferably has a wavelength that is shorter than that of the higher reflectance range. This ensures that the minimum film thickness that can be measured by the monitor light beam is obtained from extreme value of the reflection intensity, that is, from the spacing between neighboring maximums and minimums. Since this minimum optical film thickness corresponds to one-quarter of the wavelength of the monitor light beam, the measurable optical film thickness can be made smaller as the wavelength of the monitor light beam becomes shorter, enabling more accurate measurement.

The first monitor light beam used for monitoring the first film preferably has a wavelength that is within the higher reflectance range. For example, if the first film is formed of alternating optical film layers each of whose thickness corresponding to a predetermined wavelength of two types of material with different refractive indices to form a multilayer reflective film, use of a light of the predetermined wavelength as the monitor light beam enables more accurate and direct control of the optical film thickness.

The optical film thickness measurement method and film formation method of this invention stated above can be applied to a method of fabricating a semiconductor laser of this invention. More specifically, this invention provides a method of fabricating a semiconductor laser by epitaxial growth, wherein at least a DBR mirror of a first conductive type, a first clad layer and an active layer of the first conductive type, a second clad layer of a second conductive type, and a contact layer of the second conductive type are all formed on a substrate of a compound semiconductor of the first conductive type;

wherein the film thickness of the DBR mirror is measured by radiating a first monitor light beam of a predetermined wavelength towards the substrate during the film formation process and switching from the formation of one semiconductor layer to the formation of another semiconductor layer of a different refractive index when extreme value of the reflection intensity of light reflected therefrom is obtained, so that semiconductor layers having respectively high and low refractive index are formed alternately in a stack, and the mirror has a reflectance of at least 98% in a predetermined wavelength range; and the first clad layer is formed while the optical film thickness thereof is controlled by radiating a second monitor light beam of a wavelength different from those in the predetermined wavelength range towards the substrate of the DBR mirror, and monitoring extreme value of the reflection intensity of light reflected therefrom.

This DBR mirror corresponds to the first film in the above described optical film thickness measurement method and film formation method. During the formation of the films thereof, changes of the reflectance of the semiconductor layers formed on the substrate are measured by radiating a first monitor light beam of a predetermined wavelength towards the substrate and detecting the reflection intensity of light reflected therefrom. Semiconductor layers having respectively high and low refractive index are formed alternately in a stack to form the DBR mirror, by switching the deposition of one type of semiconductor layer to that of another type of semiconductor layer with a different refractive index, at extreme values (maximums and minimums) of this reflectance.

In this semiconductor laser fabrication method, the wavelength of the first monitor light beam is preferably set to be the same as the design wavelength (the center wavelength within the higher reflectance range) λ0 of the DBR mirror at room temperature. More strictly, it is preferable to use a wavelength λ0' (hereinafter called "compensated wavelength") which is the compensated design wavelength λ0 by adding temperature compensation during the film formation. The optical film thickness is expressed as the product of the refractive index and the film thickness. However, the refractive index of a crystal layer has a temperature dependency that is inherent to the material, so the film thickness depends on temperature in accordance with the coefficient of thermal expansion thereof. Thus, if the optical film thickness is to be monitored during the film formation, it is necessary to compensate the wavelength from consideration of the film growth temperature and the material. Monitoring with a first monitor light beam of a wavelength λ0 corresponding to the design wavelength of the DBR mirror, or preferably a compensated wavelength λ0', enables the spacing between maximums and minimums in the reflection intensity to coincide with one-quarter of the wave number of the design wavelength. This provides more accurate and direct control over the optical film thickness of each layer of the DBR mirror.

This reflectance is dependent only on the optical film thickness of each layer, not on the crystal growth speed or growth time. Therefore, the composition of the layers forming the stack can be changed at extreme values of the reflectance, so that layers of differing refractive index can be formed alternately by epitaxial growth, where each layer has the thickness predicted by theory. The predetermined wavelength can be set strictly by selecting a semiconductor laser having a predetermined lasing wavelength as the light source of the monitor light beam used for measuring reflection intensity. Since the reflection intensity of the DBR mirror itself can be measured during the crystal growth, the number of pairs of layers in the mirror can be varied during the film formation and thus the structure can be optimized.

The DBR mirror has a reflectance in the higher reflectance range of at least 98%, preferably at least 99%, and more preferably at least 99.5%.

The first clad layer is formed while the optical film thickness thereof is measured by a second monitor light beam having a wavelength that differs from the wavelengths in the higher reflectance range of the DBR mirror, and is preferably smaller than the wavelengths in the higher reflectance range. This first clad layer has an absorption coefficient of 1000 cm$^{-1}$ or less, preferably 100 cm$^{-1}$ or less, and more preferably between 10 cm$^{-1}$ and 100 cm$^{-1}$. The first clad layer functions as a potential barrier to prevent the intrusion of carriers (electrons and holes) into the active layer, and it is simultaneously configured as part of the optical waveguide of the laser resonator. This means that the optical absorption of the first clad layer, in other words, the presence of optical losses therein, would cause deterioration in the characteristics of the laser, such as an increase in the threshold current, a drop in the laser output efficiency, or the generation of heat within the element. Therefore it is preferable to make the absorption coefficient of the first clad layer as small as possible.

The discussion below concerns the reason why the wavelength of the monitor light beam of the first clad layer is set to be different from the wavelengths within the higher reflectance range of the DBR mirror, in the method of fabricating a semiconductor laser in accordance with this invention. At the design lasing wavelength, a DBR mirror usually has a reflectance of close to 100% in a region that is ±30 μm either side of the design lasing wavelength and the first clad layer is made of a material with small optical absorption with respect to the design lasing wavelength and wavelengths in the vicinity thereof. Therefore, if the same monitor light beam as the first monitor light beam were to be used during the formation of the first clad layer, a change in the reflectance corresponding to the optical film thickness of the first clad layer is extremely made small due to the effect of the reflection intensity of the DBR mirror, so that it would become difficult to distinguish maximums and minimums in the reflectance. Thus the use of a second monitor light beam having a wavelength different from those in the higher reflectance range of the DBR mirror as the monitor light beam for the first clad layer in accordance with this invention makes it possible to distinguish extreme values of the reflection intensity clearly and, as a result, makes it possible to accurately monitor the optical film thickness of the first clad layer.

Light of a wavelength shorter than that of the higher reflectance range is preferably used as the second monitor light beam. Use of such light, as described above, makes it possible to reduce the minimum optical film thickness that can be controlled, so that even more accurate measurement can be performed.

Moreover, in the method of fabricating a semiconductor laser in accordance with this invention, it is preferable that optical film thickness is monitored by the first monitor light beam during the formation of the active layer, second clad layer, and contact layer after the first clad layer is formed and monitored.

The optical film thickness of each layer of the semiconductor laser formed by the fabrication method of this invention, particularly that of the DBR mirror and the first clad layer, can be strictly controlled to provide a semiconductor laser that has superior characteristics such as threshold current and external differential quantum efficiency.

The method of fabricating a semiconductor laser in accordance with this invention can be applied to any semiconductor laser that comprises a DBR mirror and a first clad layer. An embedding method, a current constriction method, the formation of an active layer, or the formation of an upper active layer are not limited in the present invention.

The optical film thickness measurement method and film formation method of this invention should not be taken as being limited to a method of fabricating a semiconductor laser as described herein; they can equally well be applied to the fabrication method of other devices such as photodiodes, phototransistors, or light bulbs.

DETAILED DESCRIPTION OF PREFERRED EMBODIMENTS

Figure 1:
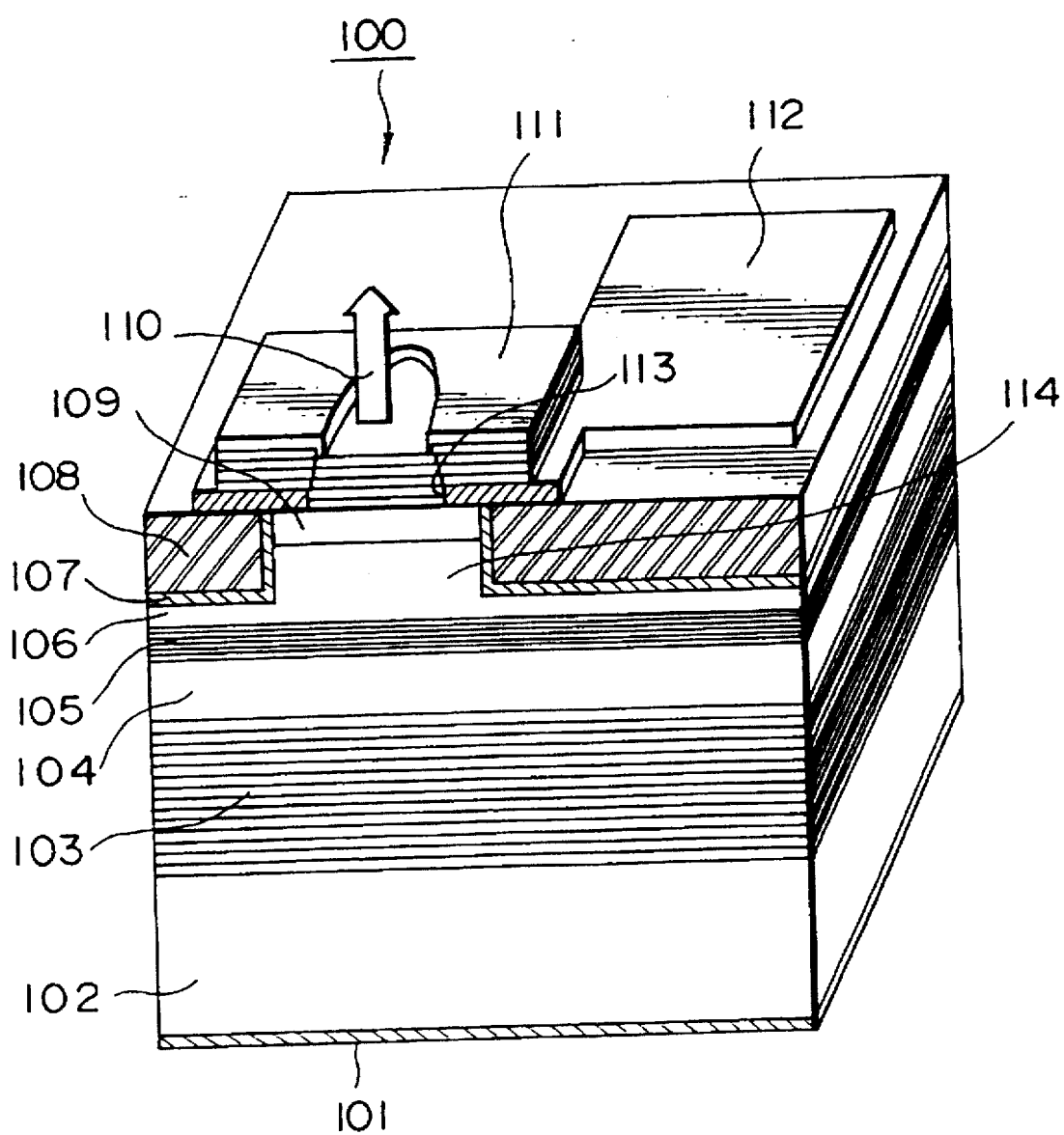
FIG. 1 is a schematic perspective view of a cross section of a surface emission type of semiconductor laser to which this invention is applied.

A schematic perspective view shown in FIG. 1 is of a cross section of a typical surface emission type of semiconductor laser that is fabricated by the optical film formation method and applying film thickness measurement method in accordance with this invention.

Structure of Semiconductor Laser

As shown in FIG. 1, a semiconductor laser 100 comprises a substrate 102 of n-type GaAs on which are sequentially deposited a distributed-Bragg reflection type of multilayer film mirror (hereinafter called "DBR mirror") 103 formed of pairs of an n-type $Al_{0.8}Ga_{0.2}As$ layer and an n-type $Al_{0.15}Ga_{0.85}As$ layer alternately deposited one above another, and having a reflectance of at least 99.5% with respect to light of a wavelength of about 800 nm; a first clad layer 104 of n-type $Al_{0.7}Ga_{0.3}As$; a quantum well active layer 105 formed of an n⁻-type GaAs well layer and an n⁻-type $Al_{0.3}Ga_{0.7}As$ barrier layer; a second clad layer 106 of p-type $Al_{0.7}Ga_{0.3}As$; and a contact layer 109 of p⁺-type $Al_{0.15}Ga_{0.85}As$.

Etching is then performed downward from the surface of the stack of semiconductor layers to partway through the second clad layer 106, to form a structure such as a cylindrical columnar portion 114 (hereinafter called "resonator portion"). The periphery of this columnar portion 114 is then embedded within a first insulation layer 107 formed of a silicon oxide film ($SiO_x$ film) such as $SiO_2$ applied by a method such as thermal Chemical Vapor Deposition (CVD) and a second insulation layer 108 formed of a heat-resistant resin such as a polyimide. The first insulation layer 107 is formed continuously over the surfaces of the second clad layer 106 and the contact layer 109, while the second insulation layer 108 is formed to cover the first insulation layer 107.

A contact metal layer (upper electrode) 112, which may be formed of Cr and an Au—Zn alloy, for example, is formed in annular contact with the contact layer 109 as a current-injection electrode. The circular portion of the contact layer 109 not covered by the upper electrode 112 is exposed. The exposed surface of the contact layer 109 (hereinafter called "opening 113") is fully covered with a dielectric multilayer film mirror 111 which comprises an $SiO_x$ (such as $SiO_2$) layer and a $Ta_2O_5$ layer alternately deposited one above another and which has a reflectance ranging between 98.5% and 99.5% with respect to light of a wavelength of about 800 nm.

An electrode metal layer (lower electrode) 101 made of a material such as Ni and an Au—Ge alloy is formed on the underside of the n-type GaAs substrate 102.

As a forward voltage is applied between the upper and lower electrodes 112 and 101 (in this embodiment, the voltage is applied from the upper electrode 112 toward the lower electrode 101), a current is injected into the semiconductor laser. The injected current is converted into light at the quantum well active layer 105. The light is reciprocated and amplified between reflecting mirrors defined by the DBR mirror 103 and the dielectric multilayer film mirror 111 to form a laser beam which is emitted outward through the opening 113 (the exposed surface of the contact layer 109) in a direction 110 which is perpendicular to the substrate 102.

The semiconductor laser of this embodiment preferably has the configuration discussed below.

(A) Structure of DBR Mirror

The reflectance of the DBR mirror 103 must be made sufficiently higher than the design lasing wavelength. A peak in the reflectance of the DBR mirror is obtained by accurate control of the optical film thickness of the semiconductor layers (of $Al_{0.8}Ga_{0.2}As$ and $Al_{0.15}Ga_{0.85}As$) configuring the DBR mirror, and the value of the peak reflectance can be increased by having more number of the pair of DBR mirror. Since the optical film thicknesses of the crystal layers within the wafer surface is never completely uniform, the reflectance spectrum of the DBR mirror has a distribution within certain region. Therefore, the reflectance of the DBR mirror is at least 98%, preferably at least 99%, and more preferably at least 99.5% in a region within ±30 nm of the design lasing wavelength. If this reflectance condition is not satisfied, a region in which laser oscillation cannot occur could be created within the wafer surface. In this embodiment, a stack of between 25 and 50 pairs, preferably 40 pairs of semiconductor layers is used for the DBR mirror, ensuring that laser oscillation at the design lasing wavelength will occur within the wafer surface, even if the optical film thicknesses vary by ±2.5%, for example.

(B) Structure of Clad Layer

The optical film thicknesses of the first and second clad layers 104 and 106 must be strictly controlled. That is, the maximum part of the electrical field strength distribution of the standing wave induced within the resonator must coincide with the position of the active layer (in the thickness direction) during laser oscillation. It ensures that the induced emission and recombination of carriers occurs efficiently in the active layer that is the source of the laser. The efficiency of the induced emission and recombination of carriers in this active layer is proportional to the integral of the electrical field strength of the standing wave present within the active layer. The electrical field strength of this standing wave has a distribution of large variations, expressed by a curve that is the square of the sine of length in the stack direction (the thickness direction). Thus when the active layer is thin, such as occurs when the optical film thickness of the active layer is less than the lasing wavelength, even a tiny error in the position of the active layer will cause a huge effect on the lasing threshold value and efficiency. In order to control the precision of the position of the active layer, therefore, it is extremely important to control the optical film thickness of the clad layers, particularly the first clad layer.

(C) Structure of Quantum Well Active Layer

The quantum well active layer 105 comprises $n^-$-type GaAs well layers and $n^-$-type $Al_{0.3}Ga_{0.7}As$ barrier layers. In this embodiment, it is an active layer of a multiple quantum well structure (MQW). The optical film thickness of the well layer ranges between 4 nm and 12 nm and is preferably equal to 4.5 nm, while the optical film thickness of the barrier layer ranges between 4 nm and 10 nm and is preferably equal to 4 nm. The total number of well layers ranges between 10 and 40 and is preferably equal to 21. This makes it possible to provide a surface emission type of semiconductor laser in which the threshold value is lower, the output is increased, the temperature characteristics are improved, and the reproducibility of the lasing wavelength is improved, in comparison with prior art lasers.

(D) Structure of Embedding Insulation Layer

The embedding insulation layer is of a double-layer structure which comprises a thin and dense silicon oxide film 107 (first insulation layer) formed by a method such as thermal CVD and a second insulation layer 108 covering the first insulation layer 107 in order to smooth the surface of the element. The first thin insulation layer 107 is formed because the second insulation layer 108 that is subsequently formed may easily contain many impurities (e.g. sodium, chlorine, heavy metals, water, and others). These impurities must be prevented from diffusing into the second clad layer 106 and the quantum well active layer 105 when the laser heats up. Therefore, the first insulation layer 107 is formed to have characteristics and a film thickness (of, for example, 50 to 200 nm) that can block these impurities. Since the first insulation layer 107 of this embodiment is formed by thermal CVD at a high temperature of 500° C. to 600° C., this first insulation layer 107 is not formed as a single thick layer from consideration of the effects of heat on the element, but it is formed as a double-layer structure of a thin first insulation layer 107 covered with a second insulation layer 108 that can be formed at a lower temperature and does not need to have such good sealing characteristics.

The second insulation layer 108 may be formed of any one material selected from a group consisting of materials that can be formed at a comparatively low temperature (400° C. or less) by a method such as CVD using an organic material (such as plasma CVD or TEOS), for example: silicon oxide layers ($SiO_x$ films) such as $SiO_2$, silicon nitride layers ($SiN_x$ films) such as $Si_3N_4$, silicon carbide layers ($SiC_x$ films) such as SiC, insulating silicon compound layers such as SOG films ($SiO_x$ such as $SiO_2$ formed by a spin-on glass method), and semiconductor films of polycrystalline II–VI group compounds (e.g., ZnSe), in addition to a heat-resistant resin such as a polyimide. Among these insulating materials, a silicon oxide such as $SiO_2$, a polyimide, or a SOG film is preferably used since they can be shaped at a relatively low temperature. More particularly, an SOG film is preferably used because it has a surface that can easily be shaped and flattened.

There are many different methods that can be used for forming the silicon oxide layer ($SiO_x$ film) that configures the first insulation layer, such as a CVD process or a reactive deposition method, and the most suitable film formation method is a normal-pressure thermal CVD process using monosilane ($SiH_4$) and oxygen ($O_2$) as reactive gases and nitrogen ($N_2$) as a carrier gas. The reason for this is because the films are formed with reactions occurring at atmospheric pressure and also under conditions of excess $O_2$. Therefore, dense $SiO_x$ films containing few oxygen defects are formed, and the step coverage is good so that substantially the same optical film thickness is obtained over the side surfaces and step portions of the resonator portion 114 as well as the flat portions of the device.

In this embodiment, the embedding insulation layer does not reach as far as the quantum well active layer 105. That is to say, a predetermined thickness (t) of the second clad layer 106 remains between the first insulation layer 107 and the quantum well active layer 105 in the region around the resonator portion 114. This remaining film thickness t is preferably set to be between 0 and 0.58 μm; more preferably between 0 and 0.35 μm. This ensures that there is no interface recombination current in the embedding insulation layer portion, making the surface emission type of semiconductor laser more efficient and more reliable.

Figure 2:
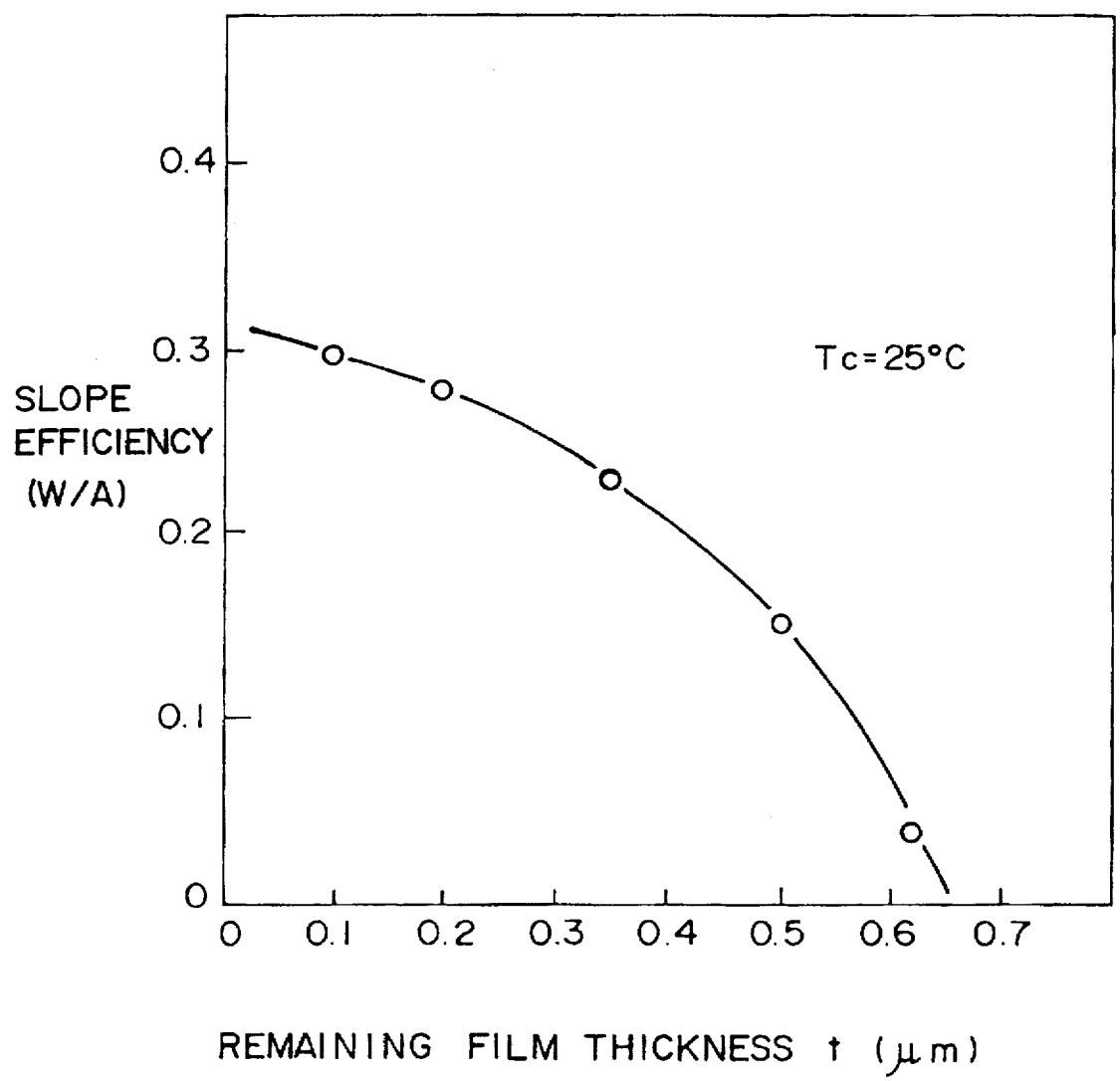
FIG. 2 is a graph which shows the relationship between the remaining film thickness t of the clad layer and the external differential quantum efficiency (slope efficiency) in the surface emission type of semiconductor laser shown in FIG. 1.

The preferable numeric ranges of this remaining film thickness t of the clad layer will now be discussed in more detail with reference to FIG. 2. In this graph, the slope of external differential quantum efficiency (slope efficiency) is plotted along the vertical axis and the remaining film thickness t of the clad layer is plotted along the horizontal axis. When the slope efficiency is 0.1, (that is, 10%), a current of 10 mA can produce an optical power of no more than 1 mW. In general, a current of 10 mA is close to the limit at which a laser element saturates thermally, so this current is effectively a boundary. Therefore, the slope required for practicable use is at least 0.1 and, since FIG. 2 shows that the remaining film thickness t is approximately 0.58 μm at a slope efficiency of 0.1, this sets the range of preferable remaining film thickness t to between 0 and 0.58 μm.

(E) Structure of Dielectric Multilayer Film Mirror

The dielectric multilayer film mirror 111 is formed from between six to nine pairs, preferably seven pairs, of dielectric layers formed of alternate $SiO_x$ (e.g. $SiO_2$) layers and $Ta_2O_5$ layers alternately deposited one above another, and has a reflectance of between 98.5% and 99.5% with respect to light of the design lasing wavelength. A reflectance of less than 98.5% would cause the lasing threshold current to rise dramatically. Conversely, a reflectance of greater than 99.5% would make it difficult to extract the optical power to the outside, reducing the external differential quantum efficiency. Therefore number of the pair of the dielectric multilayer film mirror 111 is determined in such a way that the above reflectance is achieved, and a thin film is thus formed. A material characterized in low absorption losses of light with respect to the lasing wavelength of the laser is used as the dielectric material. This is important for reducing the threshold value and increasing the external differential quantum efficiency. Layers of $ZrO_x$ film, $ZrTiO_x$ film, or $TiO_x$ film could be used instead of the $Ta_2O_5$ layers of this dielectric multilayer film mirror 111. This would make it possible to reduce the threshold value and increase the external differential quantum efficiency of the surface emission type of semiconductor laser.

Method of Fabricating Semiconductor Laser

An embodiment of the process of making the surface emission type of semiconductor laser 100 shown in FIG. 1 will now be described with reference to FIGS. 3A to 3C and FIGS. 4D to 4F which show various steps in the process schematically.

(A) The DBR mirror 103 is formed as a lower mirror from, for example, 40 pairs of an n-type $Al_{0.15}Ga_{0.85}As$ layer and an n-type $Al_{0.8}Ga_{0.2}As$ layer alternately deposited on the n-type GaAs substrate 102 and has a reflectance of at least 99.5% with respect to light of a wavelength of about 800 nm. After the n-type $Al_{0.7}Ga_{0.3}As$ layer (first clad layer) 104 has been formed on the DBR mirror 103, the active layer 105 of the multi-quantum well structure (MQW) is formed by alternately depositing n⁻-type GaAs well layers and n⁻-type $Al_{0.3}Ga_{0.7}As$ barrier layers. Thereafter, the p-type $Al_{0.7}Ga_{0.3}As$ layer (second clad layer) 106 and the p-type $Al_{0.15}Ga_{0.85}As$ layer (contact layer) 109 are sequentially deposited (see FIG. 3A).

The above layers are epitaxially grown by the metalorganic vapor phase epitaxy (MOVPE) process. An example of the condition is as follows, the growth temperature is 750° C. and the growth pressure is $2 \times 10^4$ Pa; the III-group materials are organometals such as trimethyl gallium (TMGa) or trimethyl aluminum (TMAl); the V-group material is AsH3; $H_2Se$ is used as an n-type dopant and diethyl zinc (DEZn) is used as a p-type dopant.

The optical film thickness measurement method and film formation method that characterize this invention are used this epitaxial growth process, as will be described later, to form the films while the optical film thickness of each layer is controlled accurately.

After these layers have been formed, a protective layer I is formed on the epitaxial layers by the normal-pressure thermal CVD method. This protective layer comprises an $SiO_2$ layer having a film thickness of about 25 nm. The protective layer I functions to prevent the epitaxial layers from being contaminated during the subsequent processes covering over the semiconductor layers.

(B) A resist pattern R1 is formed on the protective layer L The protective layer I, the contact layer 109 and the upper portion of the second clad layer 106 are then etched down to partway through the second clad layer 106 by reactive ion beam etching (RIBE) to leave a columnar resonator portion 114 covered with the resist pattern R1. Thus, the columnar resonator portion 114 will have the same profile as the resist pattern R1 thereon (see FIG. 3B). Use of the RIBE process ensures that the sides of the columnar portion are substantially vertical and the epitaxial layers are substantially undamaged. An example of the conditions for the RIBE process was a pressure of 60 mPa, an input microwave power of 150 W, and an outlet voltage of 350 V with the etching gas being a combination of chlorine and argon.

During the formation of the columnar portion by the RIBE process, the temperature at the substrate 102 is preferably set at a relatively low level such as between 0° C. and 40° C. and more preferably to between 10° C. and 20° C. This ensures that side etching into the semiconductor layers deposited on the substrate by epitaxial growth can be controlled. If the temperature of the substrate is between 0° C. and 10° C. it is preferable to control side etching, however, the etching rate will be slowed undesirably. If the temperature of the substrate exceeds 40° C., the etching rate increases undesirably, resulting in roughening of the etched surface and also reduced control of the etching rate.

(C) Thereafter, the resist pattern R1 is removed and the $SiO_2$ layer (first insulation layer) 107 of about 100 nm is formed by the normal-pressure thermal CVD process. An example of the conditions for this process was a substrate temperature of 450° C., materials of mono-silane ($SiH_4$) and oxygen, and a carrier gas of nitrogen. The spin-on-glass (SOG) film 108L is then coated over the first insulation layer 107 by a spin coating process. Thereafter, the SOG film 108L is be baked successively in an atmosphere of nitrogen at 80° C. for one minute, at 150° C. for two minutes, and at 300° C. for thirty minutes (see FIG. 3C).

Figure 4D:
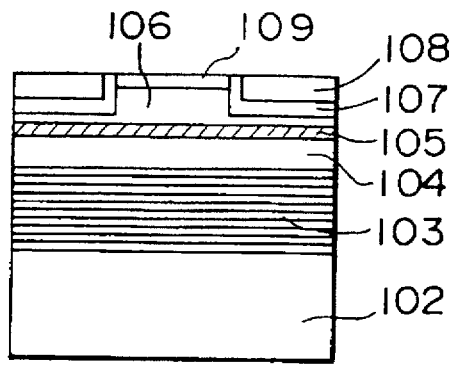
FIGS. 4D to 4F are cross-sectional views schematically showing the process of fabricating the surface emission type of semiconductor laser shown in FIG. 1, performed continuously from FIG. 3.

(D) The SOG and $SiO_2$ films 108L and 107 and the protective layer I are then etched to form a flattened surface flush with the exposed surface of the contact layer 109 (see FIG. 4D). In this case, the etching is performed by reactive ion etching (RIE) using parallel flat electrodes with the reactive gas being a combination of $SF_6$, $CHF_3$, and Ar.

Figure 4E:
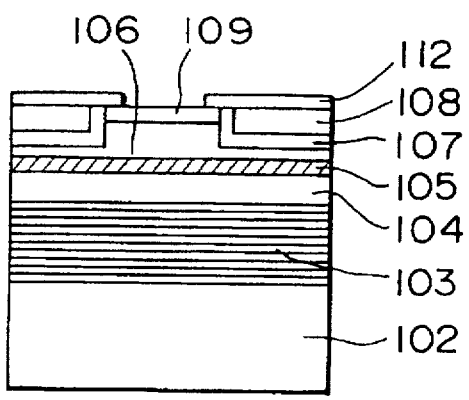
Figure 4F:
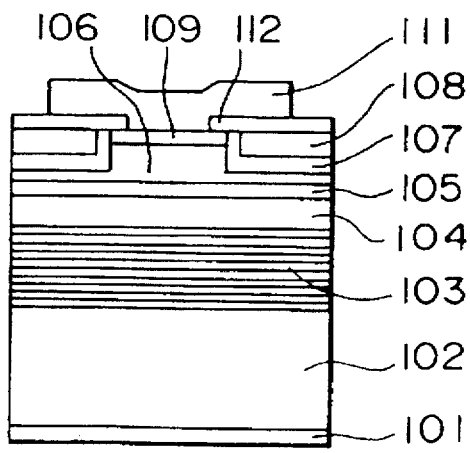

(E) The upper electrode 112 is then formed in annular contact with the contact layer 109, by a known lift-off method (see FIG. 4E).

(F) Part of the contact layer 109 remains exposed through the circular opening of the upper electrode 112. The dielectric multilayer film mirror (upper mirror) 111 is formed by a known lift-off method to cover the exposed surface of the contact layer 109 (see FIG. 4F). The formation of the upper mirror 111 is accomplished by alternately depositing seven pairs of $SiO_2$ and $Ta_2O_5$ layers by electron beam deposition. The upper mirror 111 has a reflectance ranging between 98.5% and 99.5% with respect to light of a wavelength of about 800 nm. An example of the conditions for this process was a speed of deposition of 0.5 nm/minute for $SiO_2$ and 0.2 nm/minute for $Ta_2O_5$. Note that the upper mirror 111 may be formed by etching with the RIE process, instead of the above lift-off method.

Thereafter, the lower electrode 101 is formed of Ni and an Au—Ge alloy on the lower surface of the substrate 102 to complete the surface emission type of semiconductor laser.

A method of producing the above described surface emission type of semiconductor laser having a reduced threshold current and an improved external differential quantum efficiency will now be described in detail. As described above, the crystal growth technique is one of the most important factors in the surface emission type of semiconductor laser of the present invention since the DBR mirror layer, clad layer and multiple quantum well structure are formed by crystal growth. Such a crystal growth technique requires that:

(1) The hetero-interface is sharp, namely in the order of an atom layer.

(2) The film thickness is substantially uniform over a wide area.

(3) The reproducibility of the film thickness, composition, and doping efficiency is high.

In particular, the sharpness of the interface in item (1) is important for improving the characteristics of the surface emission type of semiconductor laser. Methods of ensuring the sharpness of the interface in the crystal growing technique for compound semiconductors include molecular beam epitaxy (MBE) and metal-organic vapor phase epitaxy (MOVPE). The liquid phase epitaxy (LPE) method enables the growth of high purity crystals, but it is not suitable for use in the production of the surface emission type of semiconductor laser since it is difficult to accomplish the required sharpness of the hetero-interface because it involves growth from liquid phase to solid phase. In contrast, the MBE and MOVPE methods can theoretically provide a sharpness of the interface on the order of an atom layer because the crystal is grown on the atomic level by a molecular beam or from the vapor phase to the solid phase.

However, the growth speed cannot be increased with the MBE method because the crystal is formed by a molecular beam and thus only a relatively slow growth speed on the order of 0.01 to 0.1 nm/second can be provided. Therefore, the MBE method is not suitable for use in crystal growth that requires an epitaxial layer thickness of several microns as in the surface emission type of semiconductor laser. With the MBE method, furthermore, structural limitations of the apparatus make it difficult to grow a uniform, high-quality crystal over a large area. Moreover, a limitation on the amount of material that can be loaded restricts the number of continuous crystal growth steps. These limitations restrict the throughput of crystal growth, making it difficult to mass-produce substrates.

In contrast, the MOVPE method used in this embodiment can provide the same sharpness of the hetero-interface as the MBE method, on the order of an atom layer as described above. Since this is vapor phase growth, a growth speed of between 0.01 nm/second and several nm/second can be obtained by changing the supply quantity of material.

With regard to the uniformity of the film thickness in item (2) above, a film thickness tolerance within ±2% could be provided over substantially 75% of the area of a substrate having a diameter of 3 inches by optimizing the configuration of the reaction tube in the crystal growing apparatus.

With regard to the reproducibility of item (3), the reproducibility of the film thickness, composition, and doping efficiency can be improved by either of the MBE and MOVPE methods, because they both control the crystal growth effectively, in theory.

From balanced consideration of the above reasons, it is preferable to use the MOVPE method as the crystal growth method to implement the surface emission type of semiconductor laser of the present invention.

Placing further emphasis on item (3), it will be shown below that combining the MOVPE method with a fabrication method applied to the optical film thickness measurement method of this invention ensures that the epitaxial layers can be formed with improved reproducibility and controllability.

Figure 5:
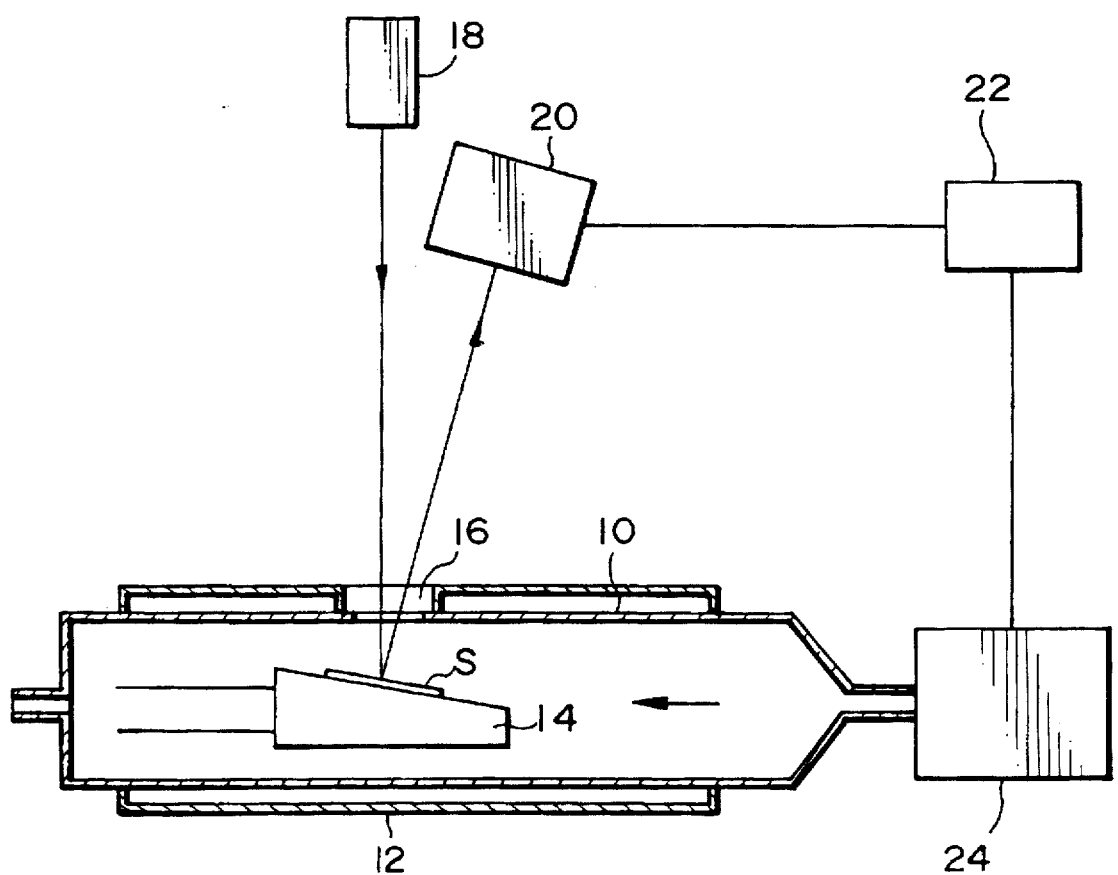
FIG. 5 is a schematic diagram of the MOVPE apparatus used during the formation of the semiconductor layer of the surface emission type of semiconductor laser shown in FIG. 1.

An example of a film formation apparatus to which the MOVPE method is applied, and which can measure the reflection intensity of the epitaxial layer at all times during the crystal growth, is shown schematically in FIG. 5. This film formation apparatus is in the form of an MOVPE system using a transverse water-cooled reaction tube, by way of example. A portion of the water-cooled tube above the growth substrate is omitted and an optical window through which light is inserted is transmitted from the outside of the reaction tube onto the growth substrate.

More specifically, the MOVPE apparatus is provided with a cooling section 12 arranged around the periphery of a reaction tube 10 supplied with a material gas of a composition controlled by a manifold valve controller 24. A substance such as water flows within the cooling section 12 to cool the reaction tube 10. A susceptor 14 on which a substrate S is to be placed is provided within the reaction tube 10. An optical window 16 is formed in the wall of the reaction tube 10 facing the susceptor 14. A light source 18 and a photosensor 20 are disposed above the optical window 16. Light from the light source 18 is transmitted to the substrate S on the susceptor 14 through the optical window 16, and light reflected therefrom is returned to the photosensor 20 through the optical window 16. The photosensor 20 is connected to a calculation control section 22 and this calculation control section 22 is connected to the manifold valve controller 24.

The light from the light source 18 is injected on substrate S substantially perpendicular to the substrate (deviating by no more than 5°). Variations in the reflection intensity of the current epitaxial layer can be measured while the epitaxial growth is proceeding on the substrate, by measuring the light reflected therefrom by the photosensor 20, as will be described later. The configuration is such that these variations in reflection intensity are processed in accordance with predetermined formulae in the calculation control section 22 and thus the obtained data can be fed back to the manifold valve controller 24.

This embodiment is characterized in that the light source 18 creates two monitor light beam systems: a first monitor light beam and a second monitor light beam. The monitor light beams can be switched to correspond to the semiconductor layer that is being formed.

Figure 6A:
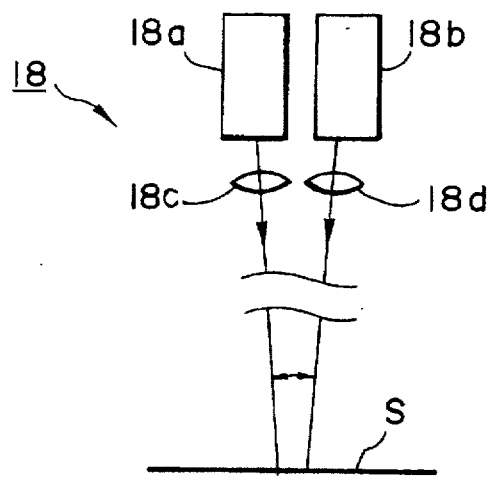
FIGS. 6A to 6C show configurational examples of the light sources in the MOVPE apparatus shown in FIG. 5.
Figure 6B:
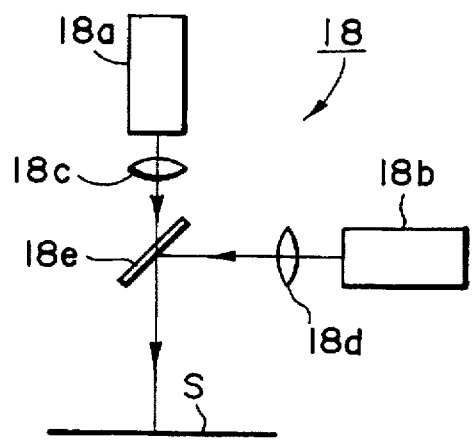
Figure 6C:
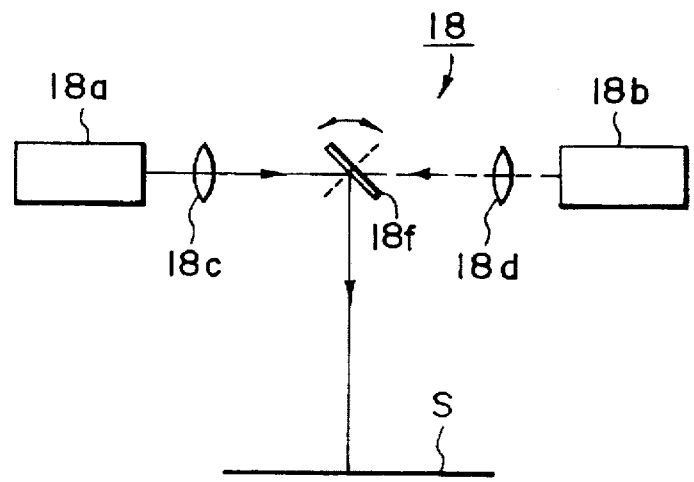

There are no particular limitations on the light source 18 that creates the two monitor light beam systems, and thus the configuration shown in FIGS. 6A to 6C can be used therefor by way of example.

The light source 18 shown in FIG. 6A is provided with two laser light sources 18a and 18b arranged in close proximity and two collimeter lens 18c and 18d arranged in the optical paths thereof, so that the two laser beams are either parallel beams of light or at least come to a focus beyond the substrate. It is preferable that the two monitor beams are injected on the substrate to within one degree of each other; more preferable that they are parallel. It is also preferable that the two monitor beams inject the same position on the substrate S.

In the light source 18 shown in FIG. 6B, the optical paths of the two laser light sources 18a and 18b are arranged to intersect one another at right angle, and a half mirror 18e is placed at the intersection point of these optical paths at, for example, an angle of 45 degrees. Collimeter lenses 18c and 18d are placed between each of the light sources 18a and 18b and the half mirror 18e. The provision of the half mirror 18e in this type of light source 18 makes it possible to have two monitor beams of predetermined wavelengths with their optical axes aligned.

In the light source 18 shown in FIG. 6C, two laser light sources 18a and 18b are arranged on the same line and a mirror 18f which has an adjustable placement angle is provided in the common optical path thereof. Also collimeter lenses 18c and 18d are placed between each of the light sources 18a and 18b and the mirror 18f.

In each of the light sources 18 shown in FIGS. 6A and 6B, the two monitor light beams can be controlled independently, so that both monitor light beam systems can illuminate at all times, or the monitor light beams can be switched by turning the operation of one of the systems on or off. With the light source 18 shown in FIG. 6C, light from either one of the light sources 18a and 18b can be selected by changing the angle of the mirror 18f, so that the monitor light beam can be switched.

Any of the examples of semiconductor lasers listed below can be used as these light sources. Note that the wavelength regions of these lasers are also listed below.

InGaAsP type: 1.2 μm to 1.6 μm and 0.62 μm to 0.9 μm

InGaAs type: 0.96 μm to 0.98 μm

GaAlAs type: 0.7 μm to 0.88 μm

InGaAlP type: 0.62 μm to 0.67 μm

ZnSSe type: 0.4 μm to 0.5 μm

ZnCdSe type: 0.4 μm to 0.5 μm

GaInAlN type: 0.3 μm to 0.5 μm

Instead of the above semiconductor lasers, any other widely used lasers for optical monitoring can be used as the light source, such as an He—Ne laser (lasing wavelength: 0.63 μm and 1.15 μm).

Figure 7A:
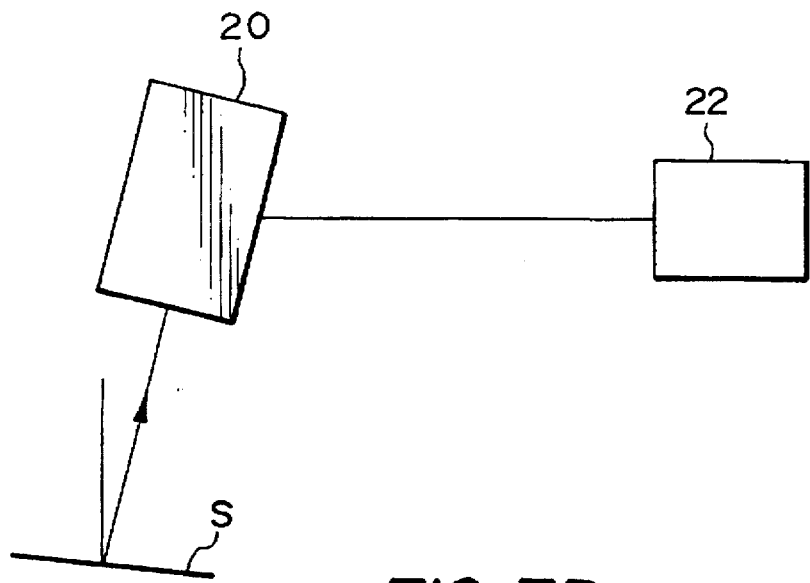
FIGS. 7A and 7B show configurational examples of the light-receiving system in the MOVPE apparatus shown in FIG. 5.
Figure 7B:
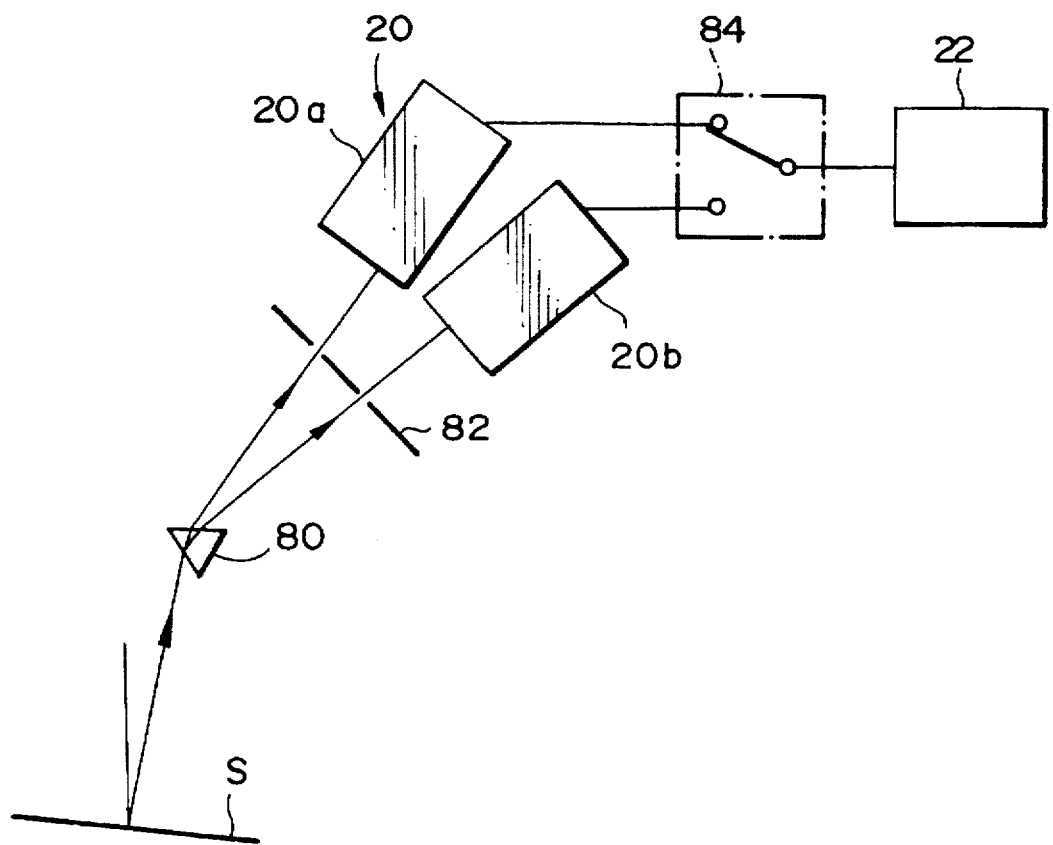

Example of the configuration of the light-receiving system are shown in FIG. 7, where FIG. 7A shows the configuration of a type with a single monitor light beam and FIG. 7B shows an example of one with two monitor light beams.

In the apparatus shown in FIG. 7A, the photosensor 20, which is a photodiode or photomultiplier tube, is connected directly to the calculation control section 22, and reflected light from the monitor light beam is output to the calculation control section 22 through the photosensor 20.

The apparatus shown in FIG. 7B comprises the photosensor 20 consisting of a first photosensor 20a and a second photosensor 20b, a spectroscopic section 80 which is formed of a prism or hologram and which is placed between the photosensors 20a and 20b and the substrate S, and a slit 82. The first photosensor 20a and the second photosensor 20b are connected to the calculation control section 22 by a switch 84. With this apparatus, the reflected light comprises components from both of the first and second monitor light beams, so this reflected light is passed to the corresponding first and second photosensors 20a and 20b through the spectroscopic section 80 and the slit 82. The output to be monitored is selectively output to the calculation control section 22 by operating the switch 84.

The concept of an apparatus used for the radiation and detection of a monitor light beam was described above, but the present invention should not be taken as being limited to this embodiment. Commonly used components such as optical means and data processing means can also be used as appropriate in the implementation of this invention.

The first and second monitor light beams will now be discussed.

The first monitor light beam is used for measuring the optical film thickness of at least the DBR mirror, and preferably the DBR mirror and the other semiconductor layers, where these semiconductor layers do not include the first clad layer 104. The second monitor light beam is used for measuring the optical film thickness of at least the first clad layer 104. The wavelengths of the first and second monitor light beams are preferably set to satisfy the conditions described below.

That is to say, the DBR mirror 103 is required to have a high degree of reflectance within predetermined wavelength region, which is at least the design lasing wavelength $\lambda_o \pm 30$ μm. Specifically it should preferably have a reflectance of at least 98.0%, more preferably of at least 99.0%, and even more preferably of at least 99.5%. In order to satisfy this condition, the thickness of each of the layers configuring the DBR mirror must be $\lambda/4n$. In this case, $\lambda$ is a predetermined wavelength (in this embodiment, it is the design lasing wavelength $\lambda_o$) and n is the refractive index at that predetermined wavelength.

Figure 8:
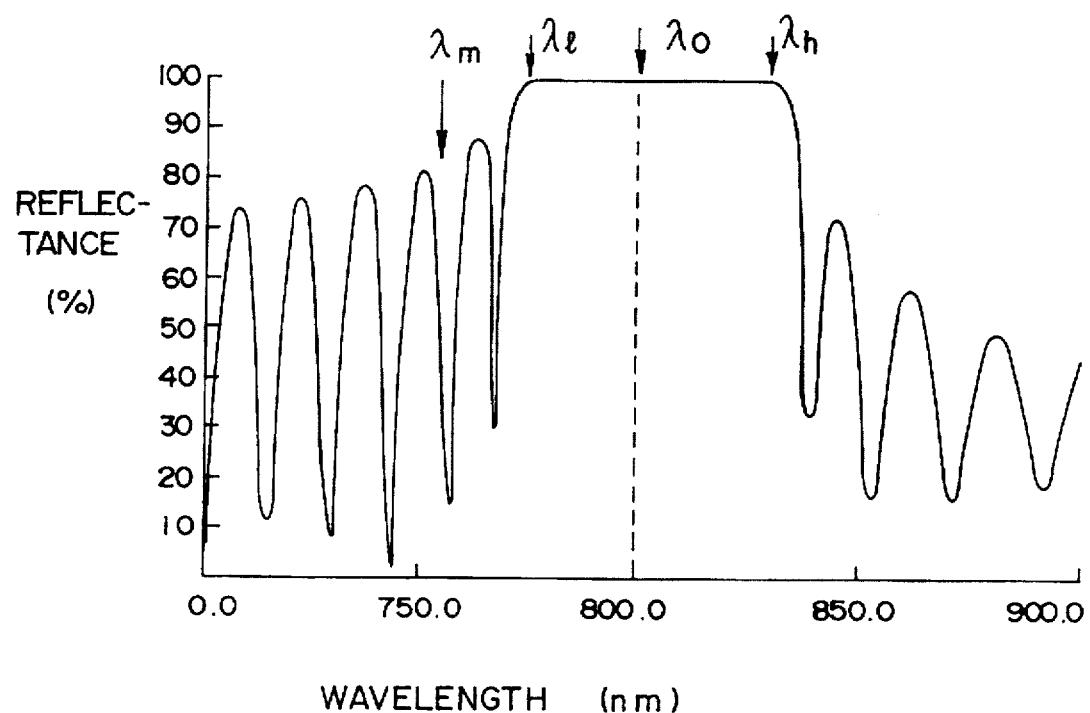
FIG. 8 is a graph of the relationship between the reflectance of the DBR mirror and wavelength in the surface emission type of semiconductor laser shown in FIG. 1.
Figure 9:
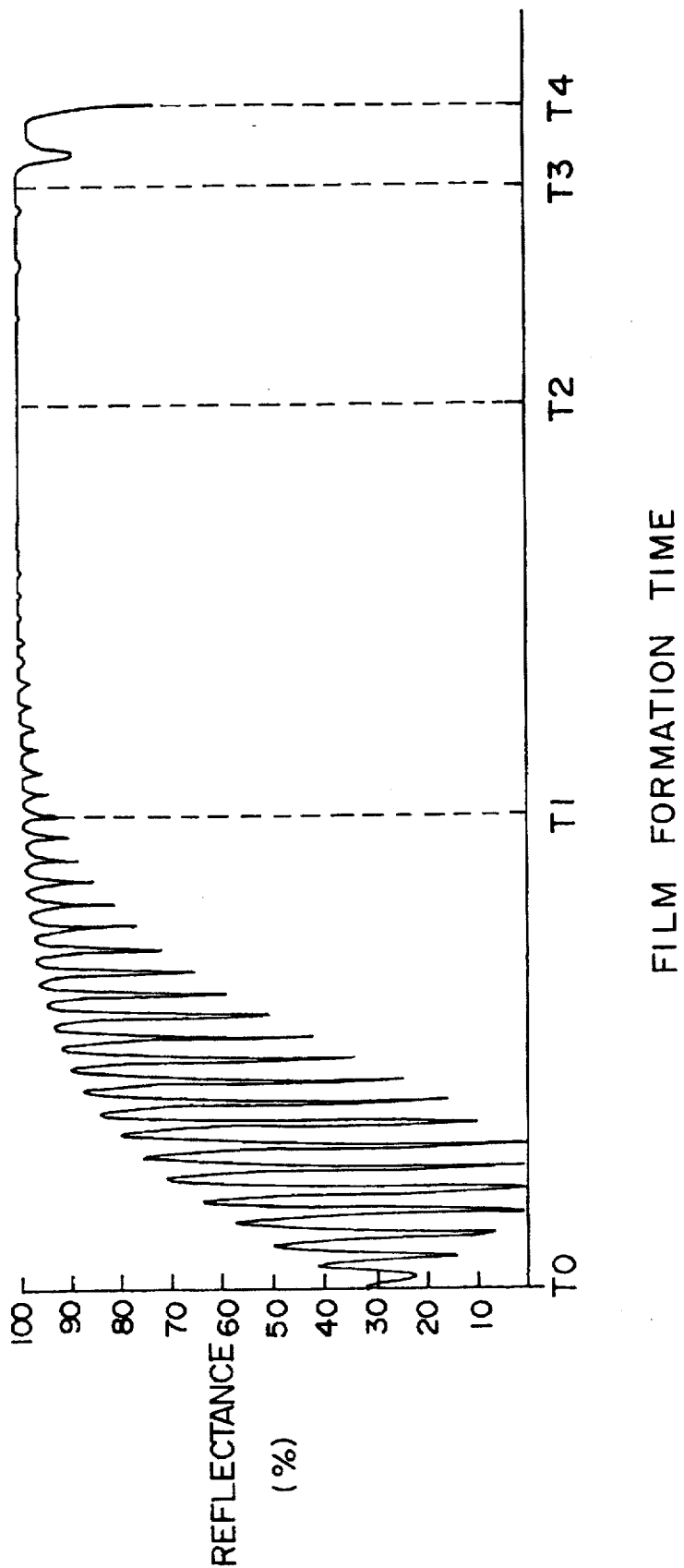
FIG. 9 is a graph of the relationship between film formation time and reflectance during the process of forming the films for the DBR mirror, first clad layer, and active layer, obtained using the first monitor light beam.
Figure 10:
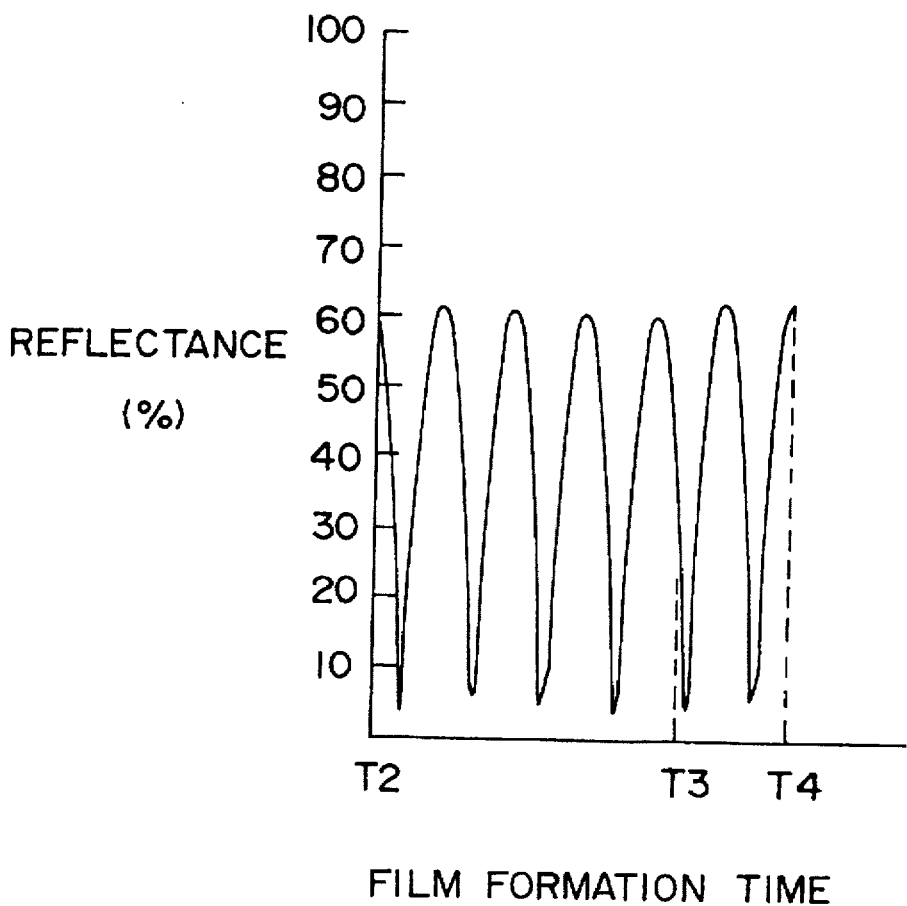
FIG. 10 is a graph of the relationship between film formation time and reflectance during the process of forming the films for the first clad layer and active layer, obtained using the second monitor light beam.
Figure 11:
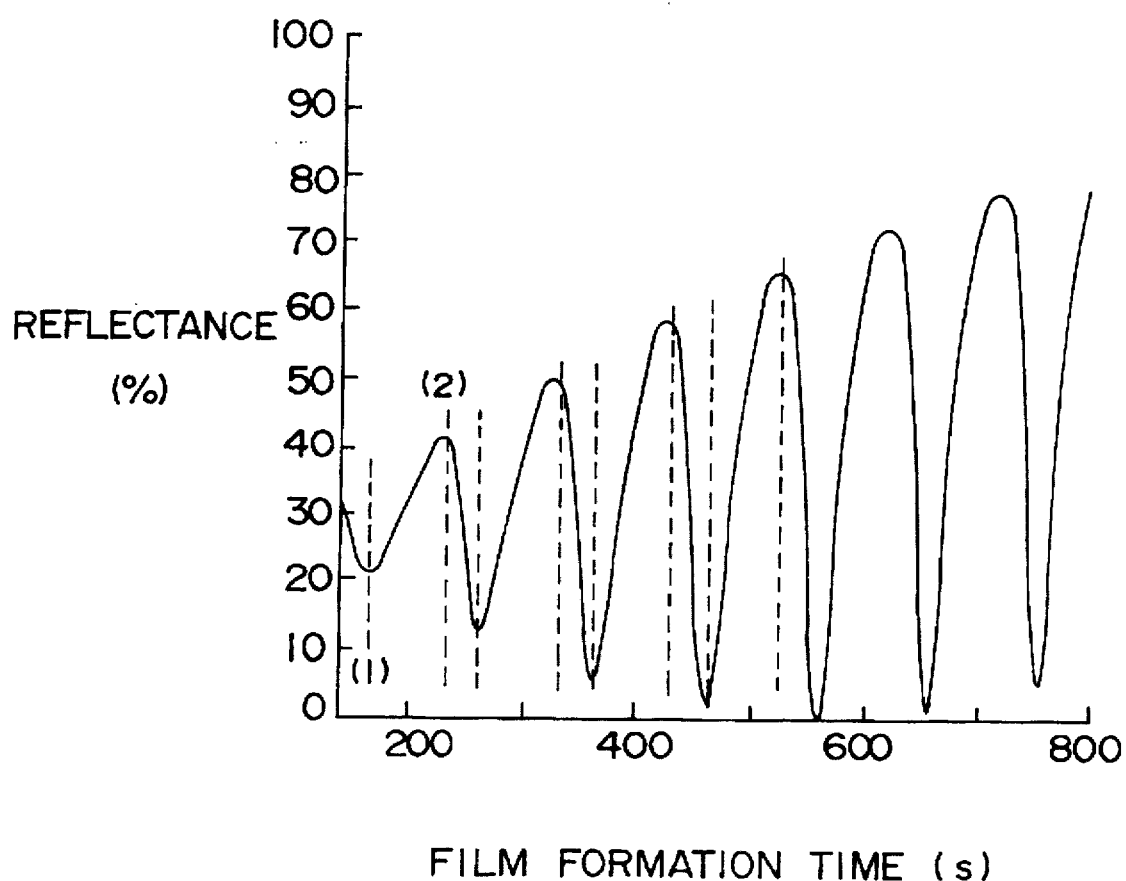
FIG. 11 is an enlargement of part of FIG. 9, schematically showing the relationship between film formation time and reflectance in the initial stages of the process of forming films for the DBR mirror.
Figure 12:
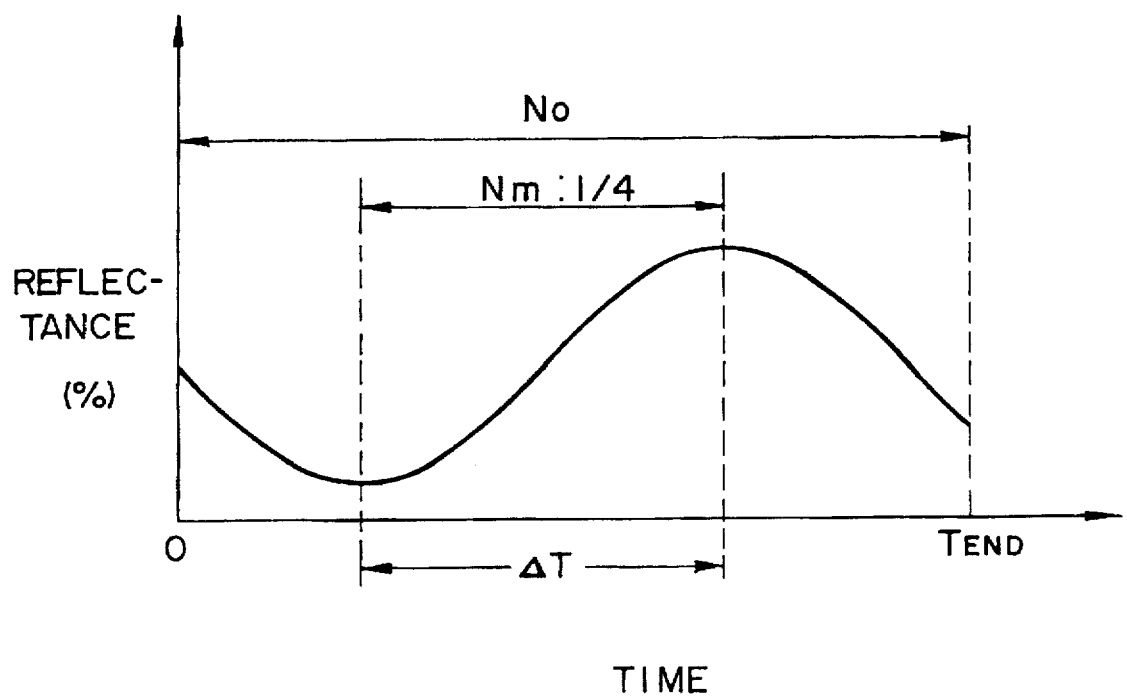
FIG. 12 is a graph of the relationship between time and reflectance during the formation of the first clad layer, when the second monitor light beam is used.

The reflectance spectrum of the DBR mirror is shown in FIG. 8, with reflectance plotted along the vertical axis and wavelength plotted along the horizontal axis. In this reflectance spectrum, the region in which the reflectance is 99.5% or more is called the "higher reflectance range." Note that the reflectance plotted along the vertical axis in each of FIGS. 9 to 11 is reflection intensity expressed as reflectance. More specifically, the relationship between reflectance and reflection intensity in the film formation apparatus of this embodiment is investigated beforehand by placing reference mirrors having reflectivities of 100%, 50%, and 0% at the substrate position in the film formation apparatus of this embodiment, and performing measurements for each monitor wavelength. Each reflection intensity is converted into a reflectance of the substrate.

The design wavelength (the center wavelength within this higher reflectance range) of the DBR mirror is set to be 800 nm, which is the design lasing wavelength $\lambda_o$ of the semiconductor laser. With an AlGaAs-type semiconductor such as that of this embodiment, it is preferable that the wavelength of each monitor light beam is set in consideration of the fact that there is a difference in optical film thickness of approximately 4.5% between the temperature at which the film is grown and room temperature. For example, a wavelength of 800 nm at room temperature corresponds to a wavelength of 836 nm at a film growth temperature of 750° C. Thus a laser beam from a semiconductor laser of a wavelength of 836 nm is used as the first monitor light beam in this embodiment. This wavelength corresponds to the design wavelength (800 nm) of the DBR mirror at room temperature.

The wavelength $\lambda_m$ of the second monitor light beam is set to a wavelength that is outside the higher reflectance range at the film growth temperature. That is, if the lowest wavelength in the higher reflectance range is $\lambda_l$ and the highest wavelength in the higher reflectance range is $\lambda_h$, either one of the following relationships hold:

$\lambda_m < \lambda_l$ $\lambda_h < \lambda_m$ is preferable to set the wavelength $\lambda_m$ of the second monitor light beam to within a wavelength region that is lower than the higher reflectance range (see FIG. 8). Thus a laser beam from a semiconductor laser having a wavelength of 786 nm is used as the second monitor light beam in this embodiment. The reasons therefor are discussed below.

During the MOVPE growth process of the surface emission type of semiconductor laser of this embodiment using the film formation apparatus of FIG. 5, changes with time in the reflectance of the epitaxial layers forming the DBR mirror 103, the first clad layer 104, and the quantum well active layer 105 were plotted as shown in FIG. 9. Growth time of the epitaxial layers is plotted along the horizontal axis and reflectance is plotted along the vertical axis. The first monitor light beam used in the reflectance measurements of FIG. 9 had a wavelength equal to a compensated wavelength $\lambda_o'$ (836 nm) in which the design lasing wavelength $\lambda_o$ was compensated for the temperature difference during film formation.

In FIG. 9, a film formation time T0 to T2 correspond to the process of forming the films for the DBR mirror 103, a film formation time T2 to T3 corresponds to the formation of the first clad layer 104, and a film formation time T3 to T4 corresponds to the formation of the active layer 105. As can be seen clearly from this graph, there are obvious extreme value (maximums and minimums) representing dramatic changes in reflectance during the initial stages of the formation (film formation time T0 to T1) of the DBR mirror 103 (the lower part of the mirror) and during the formation (film formation time T3 to T4) of the active layer 105. In contrast, such changes in reflectance are small and thus such obvious extreme values cannot be measured during the final stages of the formation (film formation time T1 to T2) of the DBR mirror 103 (the upper part of the mirror) and the formation (film formation time T2 to T3) of the first clad layer 104. That is why measurements are performed in this embodiment with a second monitor light beam having a wavelength $\lambda_m$ that differs from that of the first monitor beam, during at least the process of forming the first clad layer 104. The relationship between each film formation process and reflectance is discussed in more detail below.

(a) Film Formation for DBR Mirror

The reflectance spectrum shown in FIG. 9 for the initial stages of the process of forming films for the DBR mirror 103 is shown schematically enlarged in FIG. 11.

As can clearly be seen from FIG. 11, when the first layer of $Al_{0.8}Ga_{0.2}As$ of a low refractive index $n_1$ is deposited on the GaAs substrate, the resultant increase in the optical film thickness causes the reflectance to decrease. A minimum (1) is reached when the optical film thickness reaches $\lambda_o/4n_1$. When this minimum is detected, the material is switched to deposition of $Al_{0.15}Ga_{0.85}As$ that has a high refractive index $n_2$. The reflectance increases as the optical film thickness of the $Al_{0.15}Ga_{0.85}As$ layer increases, until it reaches a maximum (2) at an optical film thickness of $\lambda_o/4n_2$. The material is switched back to deposition of $Al_{0.8}Ga_{0.2}As$ that has a low refractive index $n_1$ when this maximum is detected. Repeating these operations, the reflectance of the DBR mirror varies repeatedly between a low level of reflectance and a high level of reflectance, until the reflectance increases to a final maximum.

These changes in reflectance are dependent only on the optical film thickness of each layer, not on the crystal growth speed or growth time. It is therefore possible to obtain a DBR mirror having an optical film thickness $\lambda/4n$ as predicted in theory, by changing the Al composition of layers at extreme values in the reflectance spectrum (where the first-order differential is zero), thereby causing the epitaxial growth of alternate layers of different refractive index.

FIG. 9 shows that the reflectance increases with increasing number of pairs during the process of forming films for the DBR mirror, but this also leads to a reduction in the changes in reflectance. In practice, it is necessary to have a balance of at least 10% between a maximum and minimum of reflectance in order to detect such a maximum or minimum accurately. In consideration thereof, the measurement data obtained during the initial-stage film formation time T0 to T1 can be used to derive film formation speeds for the region in which the DBR has a high reflectance (the region of film formation time T1 to T2 in FIG. 9), that is, after the film formation time T1 when the difference in reflectance between maximum and minimum falls to approximately 10%. The optical film thicknesses of these subsequent layers are controlled on the basis of the thus obtained film formation speed.

(b) Film Formation for First Clad Layer

The relationship between film formation time and reflectance, obtained by monitoring the first clad layer 104 and the active layer 105 by the second monitor light beam having a wavelength $\lambda_m$, is shown in FIG. 10. It is clear from this figure that measurements in which the second monitor light beam is used exhibit obvious changes in reflectance that are substantially unseen during the process of forming the first clad layer (film formation time T2 to T3) using the first monitor light beam of wavelength $\lambda_o'$, and the maximums and minimums are clearly visible.

It is necessary that the wavelength $\lambda_m$ used for the second monitor light beam is outside the higher reflectance range of the DBR mirror, as was mentioned previously. More specifically, it is necessary to select the wavelength $\lambda_m$ to be either on the shorter side of the higher reflectance range or on the longer side thereof, and a wavelength on the shorter side is preferable. This is because it is difficult to accurately measure the absolute value of reflectance, so it is usual to obtain wave numbers for the maximums and minimums in the reflection intensity. Thus the minimum optical film thickness that can be evaluated by this method is equivalent to one-quarter of the wave number at the wavelength of the monitor light beam, and therefore smaller optical film thicknesses can be measured as the wavelength of the monitor light beam becomes shorter.

The film formation speed can be calculated from the film formation time $\Delta T$ that corresponds to the wave number (¼) of the second monitor light beam, and the final film formation time for the required optical film thickness can be calculated from the thus-obtained film formation speed. Therefore, by exercising time control simultaneously with monitoring the optical film thickness, an optical film thickness of any desired wave number $N_o$ can be obtained at the design lasing wavelength $\lambda_o$ (compensated wavelength $\lambda_o'$).

if, for example, $\Delta T$ is assumed to be the timing from the minimum to the maximum with the second monitor light beam, in other words, the film formation time equivalent to ¼ the wave number ($N_m$) of the monitor light beam having wavelength $\lambda_m$, the film formation time $T_{END}$ (T3 to T2) required for forming the first clad layer is expressed by Formula 1 below.

$$T_{END} = 4N_o \frac{\lambda_o{'}}{\lambda_m} \cdot \frac{n_m}{n_o{'}} \Delta T$$

In Formula 1, $n_m$ and $n_o{'}$ are the refractive indices at the film growth temperature for each of the wavelengths $\lambda_m$ and $\lambda_o{'}$, but, since $n_m$ and $n_o{'}$ both have virtually the same dependency on temperature, the ratio therebetween can be considered to be constant irrespective of temperature. Therefore, the refractive indices at room temperature can be substituted for each of $n_m$ and $n_o{'}$.

Both the second monitor light beam having the wavelength $\lambda_m$ used for measuring the first clad layer and the first monitor light beam having the wavelength $\lambda_o$ could be radiated onto the substrate simultaneously, or a system could be used in which the first monitor light beam is switched to the second monitor light beam at a suitable timing, for example film formation time T2 in FIGS. 9 and 10.

(c) Film Formation for Active Layer and Other Layers

During the formation of the films for the active layer 105, the reflectance obtained with respect to the first monitor light beam having wavelength $\lambda_o$ (compensated wavelength $\lambda_o{'}$) varies widely, irrespective of the effects of the DBR mirror. Since these extreme values can be measured clearly, the optical film thicknesses can be accurately controlled by measuring the optical film thickness by the first monitor light beam. It is preferable that the measurement of optical film thickness by the first monitor light beam is then used for the film formation for the second clad layer 106 and contact layer 109 formed in sequence on top of the quantum well active layer 105.

This film formation method makes it possible to vary the number of pairs of layers of the DBR mirror during the formation of the layers and thus optimize the configuration, because it enables measurement to the reflection intensity of the DBR mirror itself during the crystal growth.

Since the optical film thickness of each of the first clad layer and the active layer above the DBR mirror can also be controlled accurately according to the extreme value of reflection intensity, a crystal growth substrate can be produced by a method that enables better reproducibility and a higher throughput than the prior-art film formation method in which the growth time is controlled. In practice, a DBR mirror having a reflectance of at least 99.5% which is suitable for a surface emission type of laser element can be obtained with good controllability by the growth method of this embodiment.

As mentioned above, the method of monitoring the reflectance of layers and thus controlling the optical film thickness of crystal layers is not limited to the MOVPE process. It can also be used with other film formation processes such as the MBE process.

Figure 3A:
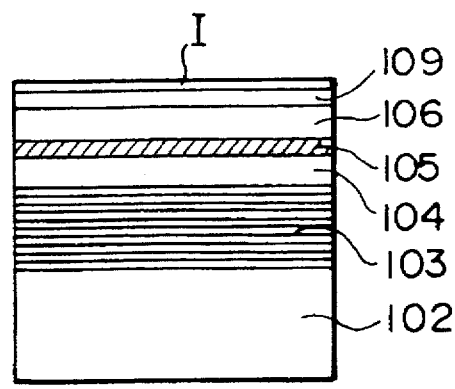
FIGS. 3A to 3C are cross-sectional views schematically showing the process of fabricating the surface emission type of semiconductor laser shown in FIG. 1.
Figure 3B:
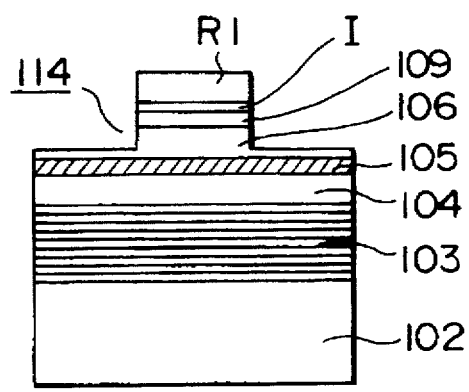
Figure 3C:
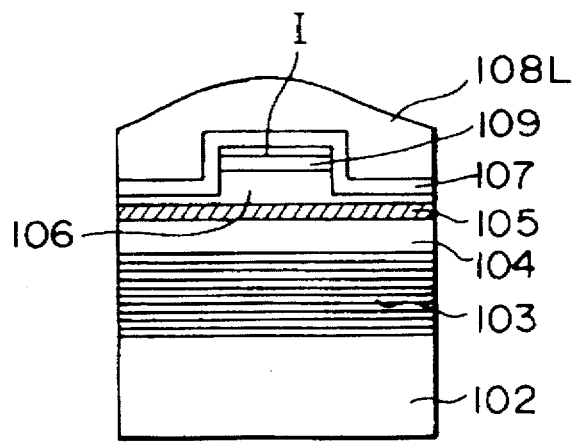

The description now turns to another embodiment of the present invention in which the above reflectance monitoring method is used in a process of forming a columnar resonator portion by the RIBE process (see FIG. 3B).

As described above, the resonator portion 114 is produced by etching with the RIBE process since this method allows the resonator portion 114 to have vertical side walls without damaging the surfaces thereof. During this formation of the columnar resonator portion, it is important to control the depth of etching, that is, the remaining film thickness t of the second clad layer 106. The reason why the remaining film thickness must be controlled to provide a predetermined thickness has already been described.

A process of measuring the remaining film thickness while performing the dry etching by the RIBE process will now be described in more detail.

Figure 13:
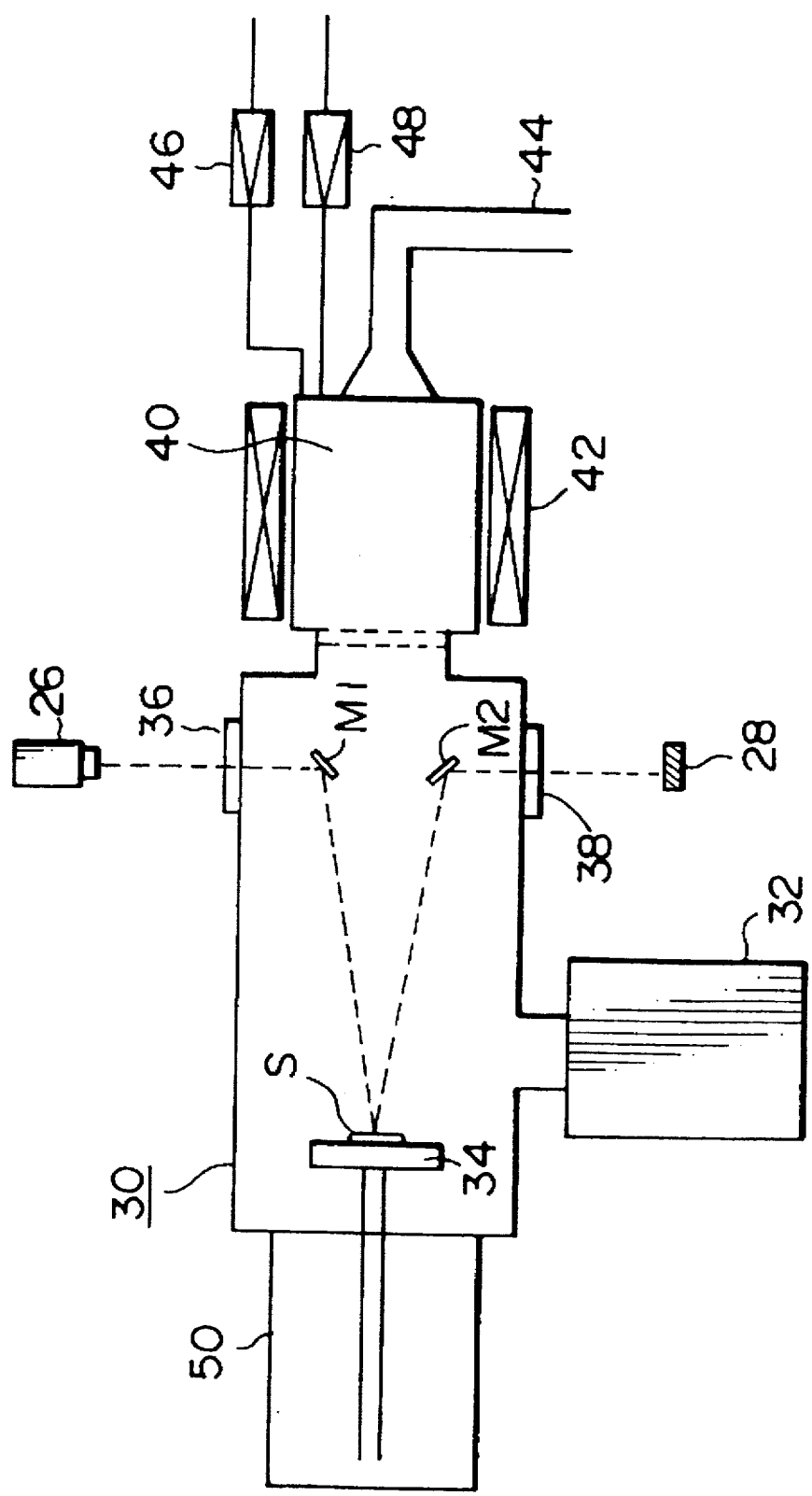
FIG. 13 shows schematically the RIBE apparatus used for the process of fabricating the surface emission type of semiconductor laser shown in FIG. 1.

An example of an RIBE apparatus which measures the reflectance of an epitaxial layer while etching is being performed is shown schematically in FIG. 13.

This RIBE apparatus comprises an etching chamber 30 communicating with a plasma chamber 40 and a vacuum pump 32 functioning as exhaust means. The etching chamber 30 is provided with a holder 34 on which a substrate S is to be placed at a position opposite to the plasma chamber 40. The holder 34 can move forward and backward through a load and lock chamber 50. The side walls of the etching chamber 30 close to the plasma chamber 40 are provided with optical windows 36 and 38 that are positioned opposite to each other. A pair of reflecting mirrors M1 and M2 are located within the etching chamber 30 on a line connecting the optical windows 36 and 38. A light source 26 is located outside one optical window 36 while a photosensor 28 is located outside the other optical window 38. The plasma chamber 40 is connected to a microwave introduction section 44 and gas supply sections 46 and 48 for supplying a reactive gas into the plasma chamber 40. A magnet 42 is located around the outside of the plasma chamber 40.

This RIBE apparatus can not only etch a crystal layer formed on the substrate S by any conventional method, but it can also monitor the reflectance of the crystal layer on the substrate S by irradiating light from the light source 26 through the optical window 36 and reflecting mirror M1 onto the substrate S and then using the photosensor 28 to measure the light reflected therefrom through the reflecting mirror M2 and the optical window 38.

The process of measuring the remaining film thickness t of the second clad layer during the etching will now be described in more detail with reference to FIGS. 14A to 14C.

Figure 14C:
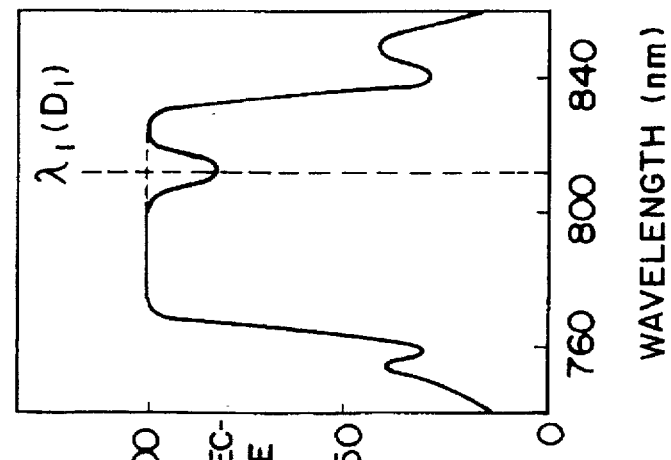
FIGS. 14A to 14C show changes in the reflection spectrum during the RIBE process.
Figure 14B:
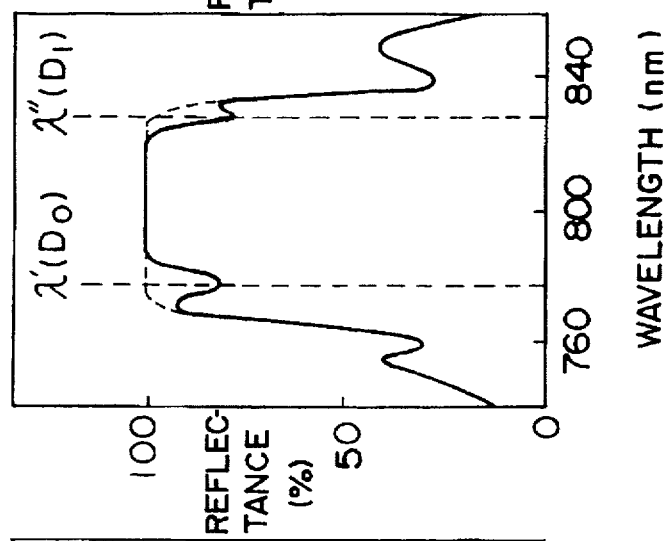
Figure 14A:
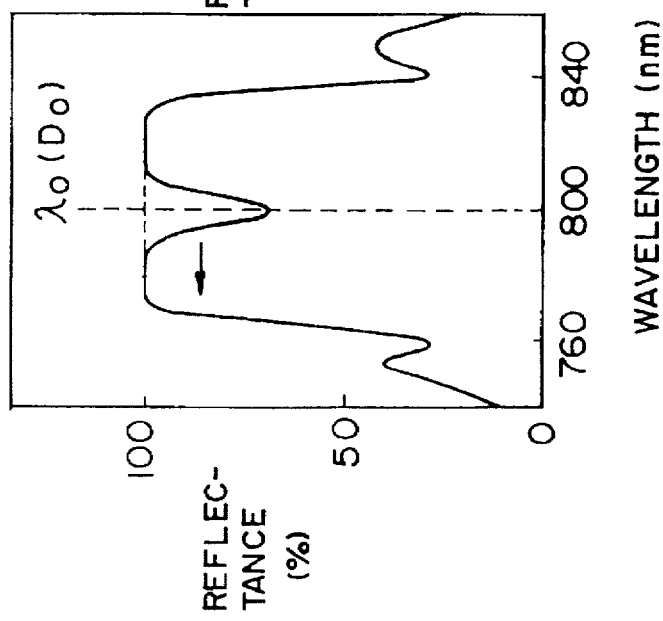

The epitaxial crystal layer structure forming the resonator before etching (shown in FIG. 3A) exhibits a reflection spectrum such as that shown in FIG. 14A. Since the reflectance of the DBR mirror is extremely high and the crystal layers on the DBR mirror are so thin, the spectrum reflected therefrom is substantially that of the DBR mirror. When light is irradiated onto the crystal layers from the outside, the active layer absorbs light of the wavelength of the standing wave (vertical mode) within the crystal layers formed in a stack on the DBR mirror, so that the reflectance at that wavelength drops and thus a depression is created in the reflection spectrum. This is a dip ($D_o$).

The wavelength $\lambda_o$ of this dip $D_o$ corresponds to the total optical film thickness of the crystal layers over the DBR mirror. As the optical film thickness is reduced by the etching, the dip $D_o$ moves toward the shorter wavelength side to reach a wavelength $\lambda'$ (see FIG. 14B).

A second dip $D_1$ of a wavelength of $\lambda''$ is produced on the longer wavelength side and then moves toward a wavelength $\lambda_l$ on the shorter wavelength side (see FIG. 14C). As the etching continues further, a new dip is again created on the longer wavelength side. This movement and appearance of dips is repeated. If it is assumed that the ath dip observed from the start of the etching has a wavelength $\lambda a$, the amount of etching $\Delta a$ is represented by the following:

$$\Delta_a = \frac{1}{n} \left( \Theta + \frac{m}{2} \right) \lambda_o - \left( \Theta + \frac{m-a}{2} \right) \lambda_o$$

where m={λ"+2Θ(λ'-λ")}/(λ'-λ'), Θ is a constant that depends on the structure and is equal to ½ or ¼ in this embodiment, and n is the mean refractive index of the epitaxial layer.

As each dip is shifted to the shorter wavelength side out of the higher reflectance range by the etching, another dip corresponding to the next longitudinal mode is produced on the longer wavelength side and then moves towards the shorter wavelength side. Therefore, the amount and speed of etching can be controlled by measuring the number of dips present in the higher reflectance range and their movement during the etching. In such a manner, the resonator portion 114 can be produced accurately, leaving a predetermined remaining film thickness in the second clad layer.

Since the level and shape of the reflection spectrum can be monitored simultaneously during the etching, estimates of contamination and damage on the surface can be carried out during the etching. The results of these estimates can be fed back to control the etching conditions.

The process of etching a layer of $SiO_2$ with the RIE process while using the reflectance monitoring means will now be described.

During the process of producing the surface emission type of semiconductor laser shown in FIG. 1, the p-type contact layer 109 on the resonator surface is covered with the surface protective $SiO_2$ layer I (see FIG. 3A) until the annular upper electrode 112 is formed on the laser beam exit side. To form the upper electrode, however, the $SiO_2$ layer must be completely etched away. Unfortunately, if the etching continues for longer than necessary, the contact layer will also be etched to the extent that it is damaged or change the resonator length with respect to the lasing wavelength.

It is therefore important to control the amount of etching of the $SiO_2$ layer I. In this embodiment, therefore, the RIE apparatus for etching the $SiO_2$ layer I is used with a process of measuring the reflectance of the epitaxial crystal layer, to determine the amount of etching during the etching step.

Figure 15:
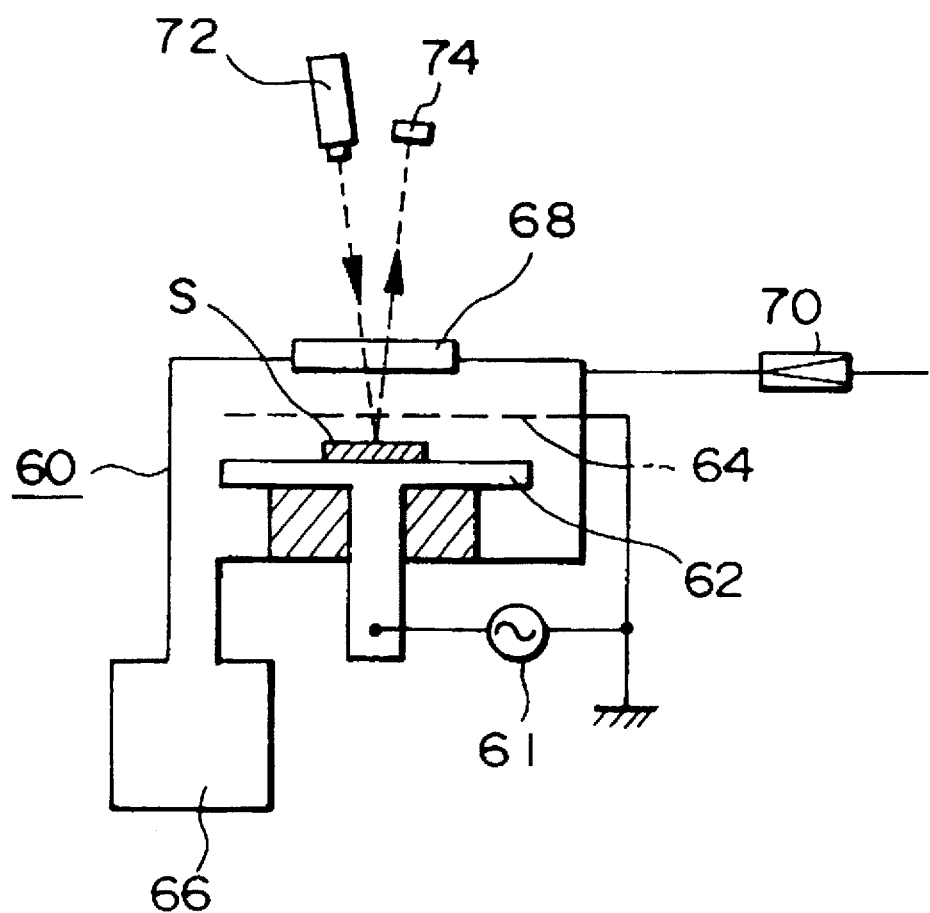
FIG. 15 shows the RIBE apparatus used in the process of etching the surface emission type of semiconductor laser shown in FIG. 1.

A parallel flat plate type of RIE apparatus that uses the reflectance measuring means is shown schematically in FIG. 15. This RIE apparatus comprises an etching chamber 60 provided with a placement electrode 62 and a mesh-like counterpart electrode 64 in a parallel arrangement. The placement electrode 62 is connected to an RF oscillator 61. The etching chamber 60 is connected to a gas supply section 70 and a vacuum exhaust pump 66. The wall of the etching chamber 60 facing the placement electrode 62 is provided with an optical window 68. A light source 72 and photosensor 74 are located outside the optical window 68. Light from the light source 72 is transmitted onto a substrate S through the optical window 68, and the light reflected therefrom enters the photosensor 74 through the optical window 68. This RIE apparatus not only etches the $SiO_2$ layer by a conventional mechanism, but it also monitors the reflectance of the etched surface by sensing the light from the light source 72 that is reflected therefrom.

Figure 16:
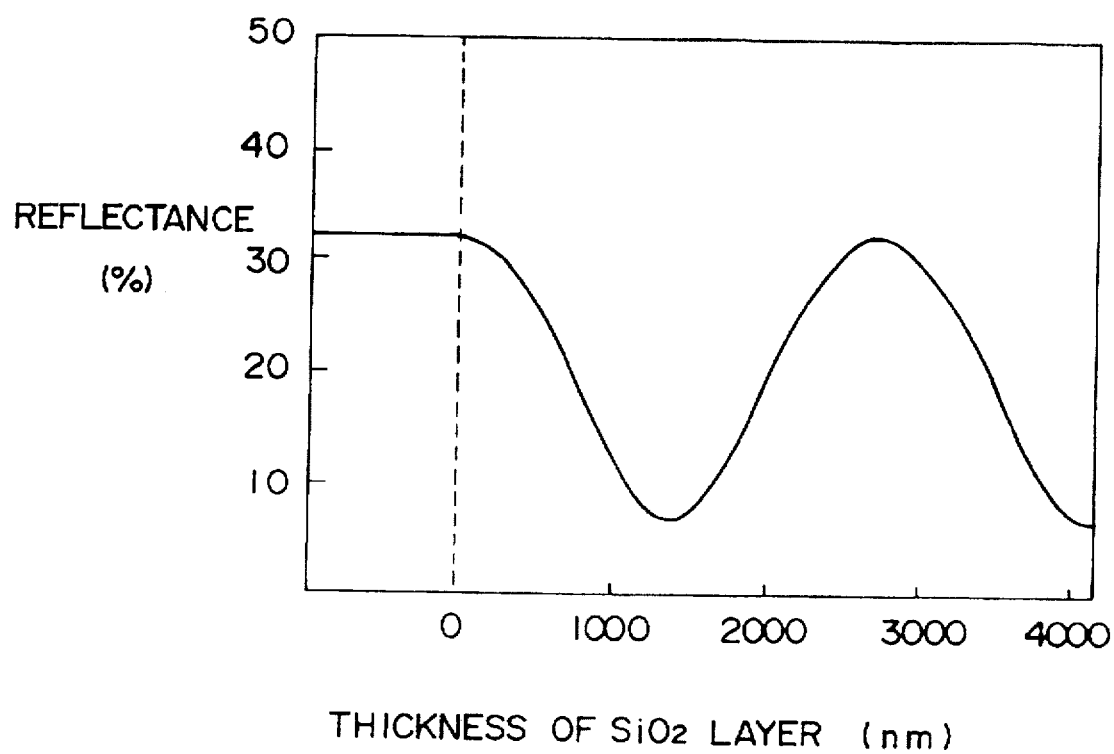
FIG. 16 is a graph of the relationship between optical film thickness of the $SiO_2$ layer and reflectance, when RIBE is performed using the apparatus shown in FIG. 15.

Variations of the reflectance of light of 800 nm when the $SiO_2$ layer is on the p-type contact layer 109 are shown in FIG. 16. The optical film thickness of the $SiO_2$ layer is plotted along the horizontal axis while reflectance is plotted along the vertical axis. As shown in this graph, the reflectance varies with the remaining film thickness of the $SiO_2$ layer. Each time the remaining film thickness becomes an λ/4n, the reflectance reaches a maximum or minimum. It is assumed herein that λ is the wavelength of the measuring light and n is the refractive index of the $SiO_2$ layer. Thus, the $SiO_2$ layer can be etched completely by measuring its reflectance and monitoring the reflectance curve during the RIE etching.

After the $SiO_2$ layer has been completely etched, the dip in the reflectance can be measured to determine the resonator length by using any suitable light source, as in the aforementioned RIBE process, for measuring the reflectance during RIE, such as light passed through a spectroscope or a laser beam of variable wavelength, which irradiates light of a wavelength ranging between 700 and 900 nm. More particularly, if the RIE etching is carried out while the dips in reflectance are measured, the amount of etching can be determined accurately to control the resonator length in accordance with the above Formula 2. The RIE process is used because the etching can be carried out with the same apparatus after the $SiO_2$ layer for protecting the p-type contact layer 109 has been completely etched and the resonator length can more easily be controlled since the RIE process can be performed at a speed slower than that of the RIBE process. At this time, the etching conditions used could be a pressure of 2 Pa, an RF power of 70 W, and the use of $CHF_3$ as the etching gas.

As described above, the lasing wavelength, which is determined by the higher reflectance range of the DBR mirror and the resonator length, must be made the same as the design lasing wavelength to implement the surface emission type of semiconductor laser of this invention. However, since the resonator can be etched accurately to any predetermined length after the epitaxial growth by using RIE while monitoring the reflectance, it is possible to fabricate a more accurate device with a good yield, even if the design lasing wavelength was not achieved by the initial processing.

Etching while monitoring reflectance can also be used to accurately form portions of different resonator lengths within the substrate surface, making it possible to fabricate two or more surface emission semiconductor lasers with different lasing wavelengths on a single substrate.

What is claimed is:

1. An optical film thickness measurement method in which a monitor light beam is radiated towards a substrate during the formation of a stack of films on said substrate, and optical film thickness is measured from extreme values of the reflection intensity of light reflected therefrom, wherein said stack of films, comprises:
a first film having a reflectance of at least 98% within a predetermined wavelength range; and
a second film formed on said first film and having an absorption coefficient of 1000 $cm^{-1}$ or less within said predetermined wavelength range;
said optical film thickness measurement method comprises the steps of:
measuring said first film by a first monitor light beam having a predetermined wavelength dependent on the predetermined wavelength range; and
measuring said second film by a second monitor light beam having a wavelength that differs from said predetermined wavelength range.

2. The optical film thickness measurement method as defined in claim 1, wherein said second monitor light beam has a wavelength shorter than said predetermined wavelength range.

3. The optical film thickness measurement method as defined in claim 1, wherein said first monitor light beam has a wavelength comprised within said predetermined wavelength range.

4. The optical film thickness measurement method as defined in claim 2, wherein said first monitor light beam has a wavelength comprised within said predetermined wavelength range.

5. A film formation method for forming a stack of films on a substrate;

wherein said stack of films, comprises:
 a first film having a reflectance of at least 98% within a predetermined wavelength range; and
 a second film formed on said first film and having an absorption coefficient of 1000 $cm^{-1}$ or less within said predetermined wavelength range;
 said first film is formed while a first monitor light beam having a predetermined wavelength dependent on the predetermined wavelength range is radiated towards said substrate and the optical film thickness thereof is monitored from extreme values of the reflection intensity of light reflected therefrom; and
 said second film is formed while a second monitor light beam having a wavelength different from those in said predetermined wavelength range is radiated towards said substrate and the optical film thickness thereof is monitored from extreme values of the reflection intensity of light reflected therefrom.

6. The film formation method as defined in claim 5, wherein said second monitor light beam has a wavelength shorter than said predetermined wavelength range.

7. The film formation method as defined in claim 5, wherein said first monitor light beam has a wavelength comprised within said predetermined wavelength range.

8. The film formation method as defined in claim 6, wherein said first monitor light beam has a wavelength comprised within said predetermined wavelength range.

9. A method of fabricating a semiconductor laser, wherein a stack of semiconductor layers are formed on the substrate of a first conductive type by epitaxial growth, and wherein said stack of semiconductor layers comprises at least a distributed-Bragg reflection type of multilayer film mirror (DBR mirror) of a first conductive type, a first clad layer of the first conductive type, an active layer, a second clad layer of a second conductive type, and a contact layer of the second conductive type;

wherein the thickness of said DBR mirror is measured by radiating a first monitor light beam having a predetermined wavelength towards said substrate during the film formation process and switching from the formation of one semiconductor layer to the formation of another semiconductor layer of a different refractive index when extreme value of the reflection intensity of light reflected therefrom is obtained, so that semiconductor layers having respectively high and low refractive index are formed alternately in a stack, and said DBR mirror has a reflectance of at least 98% in a predetermined wavelength range; and said first clad layer is formed while the optical film thickness thereof is controlled by radiating a second monitor light beam having a wavelength different from those in said predetermined wavelength range towards said substrate, and monitoring extreme values of the reflection intensity of light reflected therefrom.

10. The method of fabricating a semiconductor laser as defined in claim 9, wherein said distributed-Bragg reflection type of multilayer film mirror has a reflectance of at least 99% within said predetermined wavelength range.

11. The method of fabricating a semiconductor laser as defined in claim 9, wherein said first clad layer has an absorption coefficient of 1000 $cm^{-1}$ or less.

12. The method of fabricating a semiconductor laser as defined in claim 9, wherein said first clad layer has an absorption coefficient of 100 $cm^{-1}$ or less.

13. The method of fabricating a semiconductor laser as defined in claim 9, wherein said second monitor light beam has a wavelength shorter than said predetermined wavelength range.

14. The method of fabricating a semiconductor laser as defined in claim 9, wherein said first monitor light beam has the same wavelength as the design lasing wavelength of said semiconductor laser.

15. The method of fabricating a semiconductor laser as defined in claim 13, wherein said first monitor light beam has the same wavelength as the design lasing wavelength of said semiconductor laser.

16. The method of fabricating a semiconductor laser as defined in claim 9, wherein said active layer, said second clad layer, and said contact layer are formed while the optical film thicknesses thereof are controlled by measuring with said first monitor light beam.

* * * * *